United States Patent
Zeng et al.

(10) Patent No.: US 9,287,765 B2
(45) Date of Patent: Mar. 15, 2016

(54) POWER SYSTEM, POWER MODULE THEREIN AND METHOD FOR FABRICATING POWER MODULE

(71) Applicant: DELTA ELECTRONICS, INC., Taoyuan Hsien (TW)

(72) Inventors: Jian-Hong Zeng, Taoyuan Hsien (CN); Shou-Yu Hong, Taoyuan Hsien (CN); Xue-Tao Guo, Taoyuan Hsien (CN)

(73) Assignee: DELTA ELECTRONICS, INC., Taoyuan (TW)

( * ) Notice: Subject to any disclaimer, the term of this patent is extended or adjusted under 35 U.S.C. 154(b) by 346 days.

(21) Appl. No.: 13/845,118

(22) Filed: Mar. 18, 2013

(65) Prior Publication Data

US 2013/0214842 A1 Aug. 22, 2013

Related U.S. Application Data

(63) Continuation-in-part of application No. 13/074,539, filed on Mar. 29, 2011, now Pat. No. 8,488,316.

(30) Foreign Application Priority Data

Jul. 15, 2010 (CN) .......................... 2010 1 0230158
Dec. 3, 2012 (CN) .......................... 2012 1 0509103

(51) Int. Cl.
*H05K 7/20* (2006.01)
*H03L 5/00* (2006.01)
(Continued)

(52) U.S. Cl.
CPC ............... *H02M 1/143* (2013.01); *H01L 24/49* (2013.01); *H01L 25/50* (2013.01); *H02M 7/003* (2013.01); *H05K 5/064* (2013.01); *H05K 7/1432* (2013.01); *H05K 7/209* (2013.01); *H01L 2224/45147* (2013.01); *H01L 2224/4846* (2013.01); *H01L 2224/48091* (2013.01); *H01L 2224/48247* (2013.01); *H01L 2224/49111* (2013.01);
(Continued)

(58) Field of Classification Search
None
See application file for complete search history.

(56) References Cited

U.S. PATENT DOCUMENTS

| 5,057,906 A | 10/1991 | Ishigami |
| 6,257,215 B1 | 7/2001 | Kaminaga et al. |
| 6,313,520 B1 | 11/2001 | Yoshida et al. |
| 7,170,766 B2 * | 1/2007 | Lopez et al. ................ 363/65 |

(Continued)

FOREIGN PATENT DOCUMENTS

| CN | 85104913 A | 1/1987 |
| CN | 101417602 A | 4/2009 |

(Continued)

*Primary Examiner* — Lincoln Donovan
*Assistant Examiner* — Khareem E Almo
(74) *Attorney, Agent, or Firm* — CKC & Partners Co., Ltd.

(57) ABSTRACT

A power system, a power module therein and a method for fabricating power module are disclosed herein. The power module includes a first and a second common pins, and a first and a second bridge arms. The first and the second common pins are symmetrically disposed at one side of a substrate. The first bridge arm includes a first and a second semiconductor devices, and the first and the second semiconductor devices are connected to each other through the first common pin and disposed adjacently. The second bridge arm includes a third and a fourth semiconductor devices, and the third and the fourth semiconductor devices are connected to each other through the second common pin and disposed adjacently. The first and the third semiconductor devices are disposed symmetrically, and the second and the fourth semiconductor devices are disposed symmetrically.

39 Claims, 21 Drawing Sheets

(51) Int. Cl.
*H02M 1/14* (2006.01)
*H01L 25/00* (2006.01)
*H02M 7/00* (2006.01)
*H05K 7/14* (2006.01)
*H01L 23/00* (2006.01)
*H05K 5/06* (2006.01)
*H01L 23/473* (2006.01)
*H01L 23/367* (2006.01)
*H02M 7/5388* (2007.01)

(52) U.S. Cl.
CPC . *H01L2924/1305* (2013.01); *H01L 2924/1306* (2013.01); *H01L 2924/13055* (2013.01); *H01L 2924/13091* (2013.01); *H01L 2924/15787* (2013.01); *H01L 2924/3025* (2013.01); *H01L 2924/30107* (2013.01); *H02M 7/5388* (2013.01)

(56) References Cited

U.S. PATENT DOCUMENTS

| | | | |
|---|---|---|---|
| 7,375,984 B2* | 5/2008 | Lee Tai Keung | 363/16 |
| 7,768,807 B2* | 8/2010 | Chen et al. | 363/127 |
| 2002/0024134 A1 | 2/2002 | Shimada et al. | |
| 2007/0290656 A1 | 12/2007 | Lee Tai Keung | |
| 2009/0140369 A1 | 6/2009 | Lee | |
| 2011/0305049 A1* | 12/2011 | Raptis et al. | 363/34 |
| 2012/0044722 A1* | 2/2012 | Cuk | 363/21.03 |
| 2012/0281444 A1* | 11/2012 | Dent | 363/56.01 |
| 2013/0127358 A1* | 5/2013 | Yao | 315/201 |

FOREIGN PATENT DOCUMENTS

| | | |
|---|---|---|
| CN | 101496163 A | 7/2009 |
| CN | 101622779 A | 1/2010 |
| CN | 101640494 A | 2/2010 |
| JP | 2009-278772 A | 11/2009 |
| TW | 201216446 A | 4/2012 |

* cited by examiner

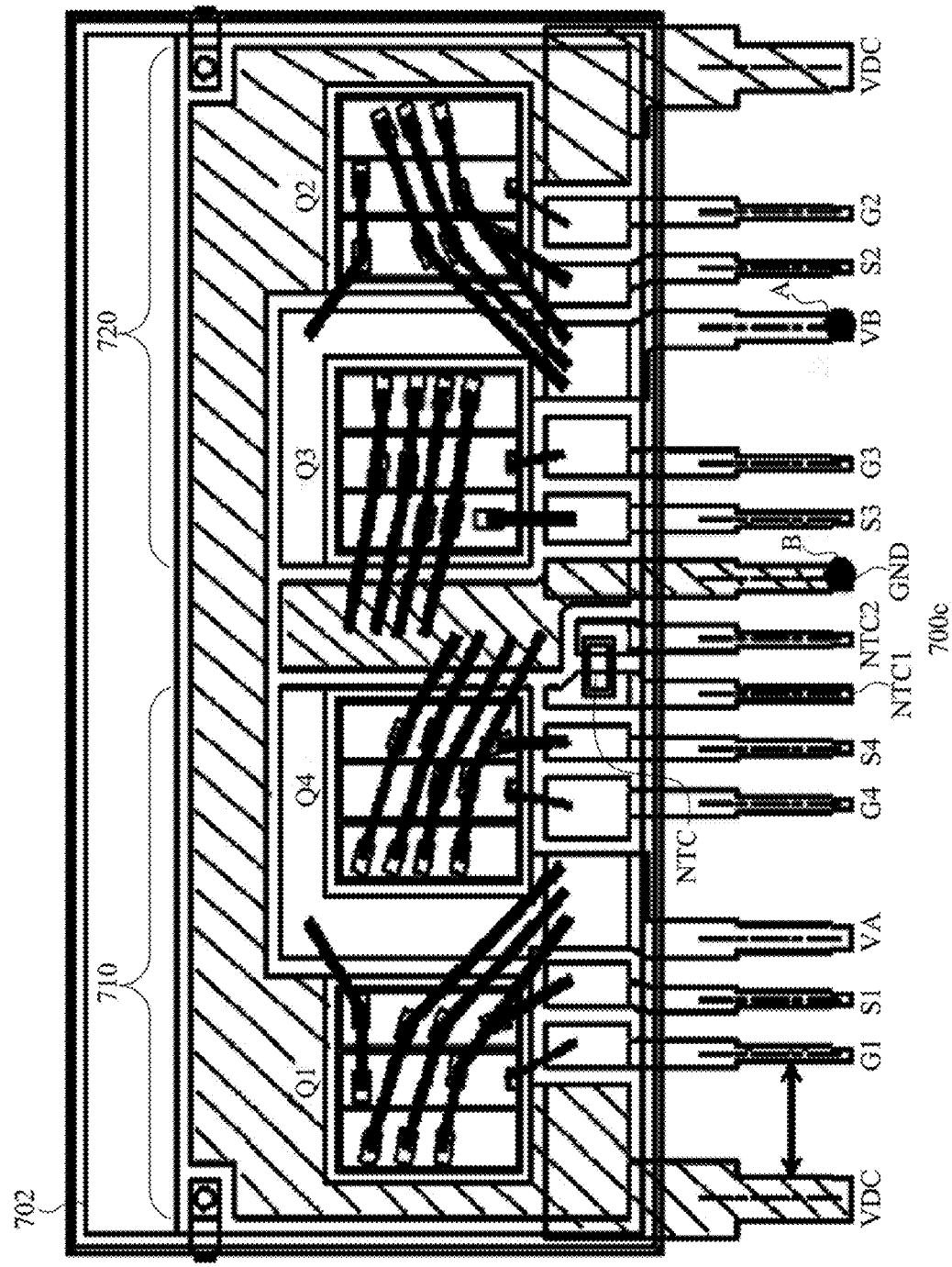

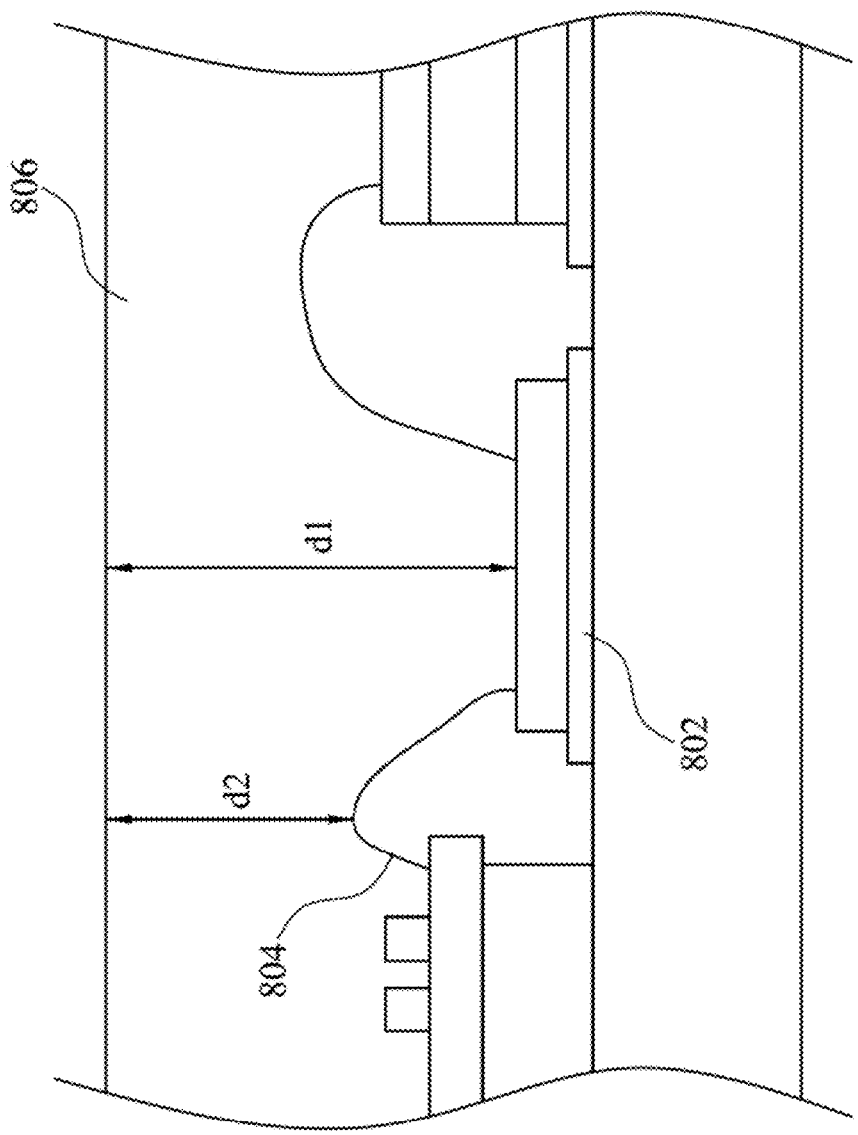

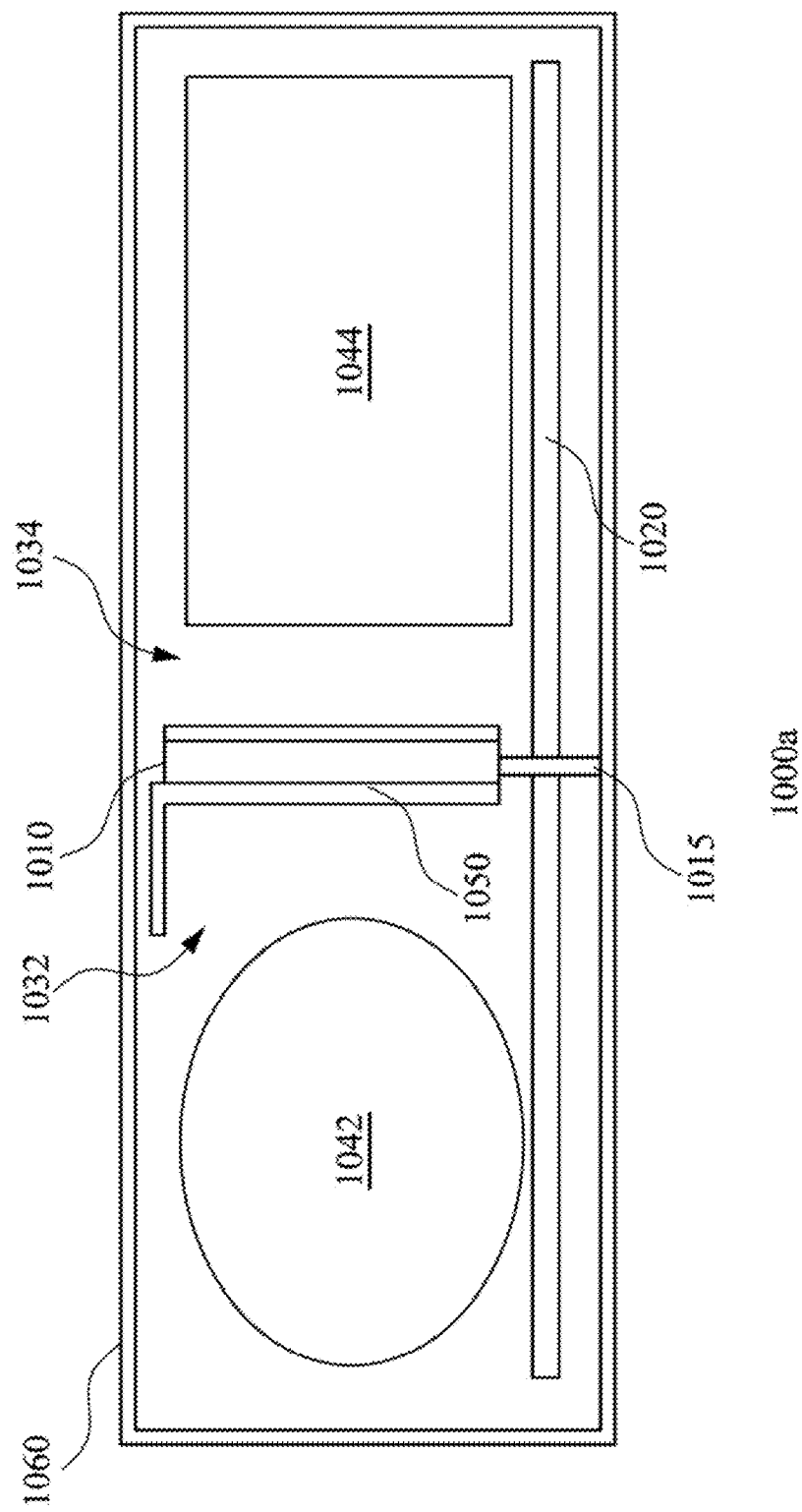

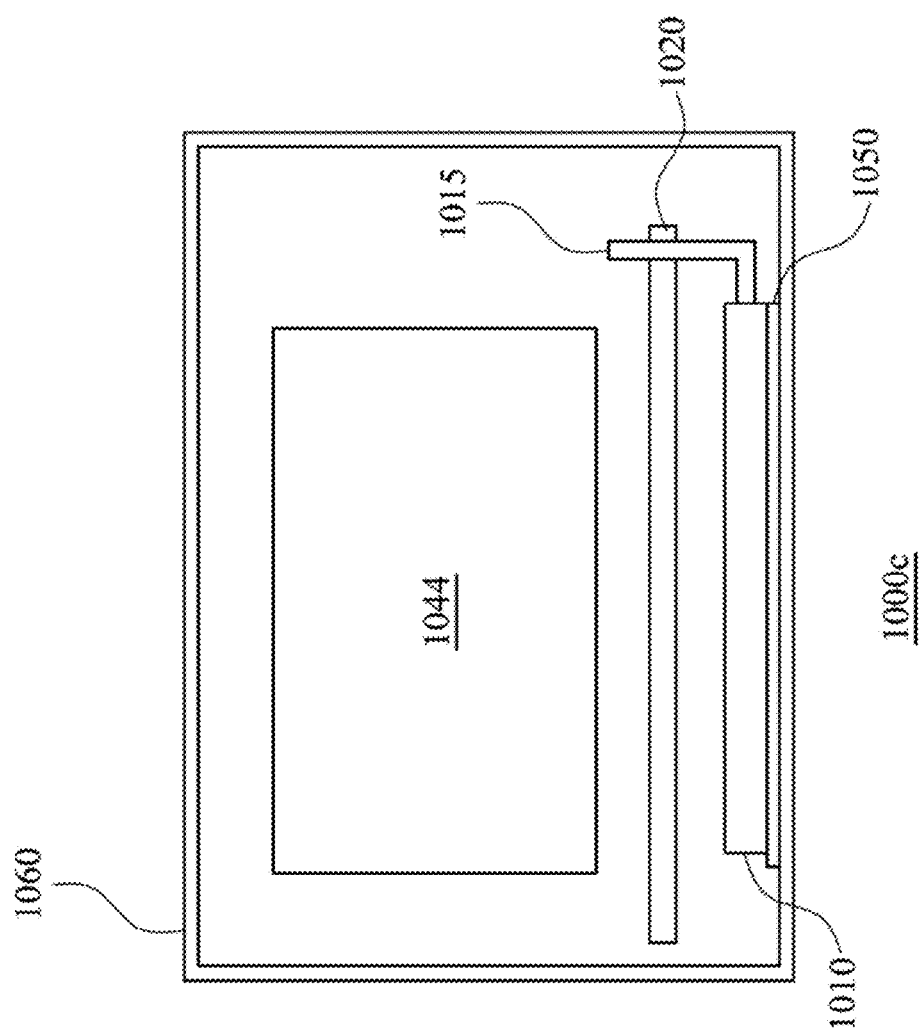

POWER SYSTEM, POWER MODULE THEREIN AND METHOD FOR FABRICATING POWER MODULE

CROSS-REFERENCE TO RELATED APPLICATIONS

This application is a continuation-in-part of U.S. application Ser. No. 13/074,539, filed on Mar. 29, 2011, which claims priority to Chinese Application Serial Number 201010230158.X, filed Jul. 15, 2010, currently pending. The present application is also based on, and claims priority from to Chinese Application Serial Number 201210509103.1 filed Dec. 3, 2012. All of these applications are incorporated herein by this reference.

BACKGROUND

1. Technical Field

The disclosure relates to a power module, and more particularly relates to a power module applied in a power converter.

2. Description of Related Art

High efficiency and high power density are always required for the power converter in the industry. High efficiency means reduction of power consumption, which is beneficial for energy conservation and emission reduction to protect the environment and reduce the use cost. High power density means small volume and light weight, which is beneficial for reduction of transportation cost and required space to reduce the construction cost; and the high power density also means the reduction of the usage amount of materials, which is further beneficial for energy conservation and emission reduction to protect the environment. Therefore, the pursuit of high efficiency and high power density is never stopped in the field of power.

There are different kinds of power converters for different applications. According to the converting types of power, the power converters may be divided into: a non-isolated AC/DC power converter, for example formed by an AC/DC power converter applied in a power factor correction (PFC) circuit; a non-isolated DC/DC power converter; an isolated DC/DC power converter; an isolated AC/DC power converter, for example formed by a PFC circuit and one or more DC/DC power converters; and other power converters such as DC/AC power converters, AC/AC power converters and the like. Since the characteristics of the power to be converted are different and the converting grade levels are also different, the power densities and efficiencies which can be easily realized are different among various converters. Taking the isolated AGOG power converter as an example, currently the general power density thereof in the industry is 15 w/inch$^3$ and the efficiency thereof is about 92%, while the non-isolated AC/DC power converter, the isolated DC/DC power converter and the DC/AC power converter have higher efficiencies and power densities.

As described above, the high efficiency of the power converter means low power consumption. For example, when the efficiency is 90%, the power consumption for conversion is about 10% of the total input energy of the entire power converter, and for the power converter with the efficiency of 91%, the power consumption for conversion is reduced to 9% of the total input energy. In other words, each time when the efficiency of the power converter is increased by 1%, the power consumption thereof is reduced by 10% relative to the power converter with the efficiency of 90%, which is significant. Actually, the efficiency of the power converter is often increased in the grade level of 0.5%, and even 0.1%.

The power converter is generally provided with integrated power modules therein, and the devices in the power modules are connected through bonding wires, lead frames and the like, which causes a large number of parasitic inductances in the circuit. However, parasitic inductances in the circuit described above reduce the capability of two devices connected in series in the same bridge arm of the power module for helping clamp for each other, which generates voltage spikes or peaks when a turn-off operation is performed on the devices. This not only affects the reliability of the power module, but also causes various electromagnetic interferences. Even seriously, the greater the parasitic inductance is, the greater the voltage spike generated during the turn-off operation of the devices is, which finally results in the damage of the devices.

SUMMARY

An aspect of the disclosure provides a power module including a bridge circuit. The bridge circuit includes a first bridge arm and a second bridge arm. The first bridge arm has a first terminal, a second terminal and a third terminal. The first bridge arm includes a first semiconductor device and a second semiconductor device. The first semiconductor device and the second semiconductor device are electrically connected to the third terminal of the first bridge arm. The second bridge arm has a first terminal, a second terminal and a third terminal. The second bridge arm includes a third semiconductor device and a fourth semiconductor device. The third semiconductor device and the fourth semiconductor device are electrically connected to the third terminal of the second bridge arm. The first bridge arm and the second bridge arm are connected in parallel with each other, and circuit positions of the first bridge arm and the second bridge arm are substantially symmetric with each other, so as to reduce the voltage spikes generated during the operations of the first, second, third and fourth semiconductor devices.

Another aspect of the disclosure provides a power module including a first common pin, a second common pin, a first bridge arm and a second bridge arm. The first common pin and the second common pin are symmetrically disposed at one side of a substrate. The first bridge arm is disposed on the substrate and includes a first semiconductor device and a second semiconductor device. The first semiconductor device and the second semiconductor device are connected to each other through the first common pin and disposed adjacently. The second bridge arm is disposed on the substrate, and includes a third semiconductor device and a fourth semiconductor device. The third semiconductor device and the fourth semiconductor device are connected to each other through the second common pin and disposed adjacently. The first and the third semiconductor devices are disposed symmetrically, and the second and the fourth semiconductor devices are disposed symmetrically and respectively disposed on the side of the first semiconductor device and the side of the third semiconductor device.

A further aspect of the disclosure provides a power system including a power module and a circuit board. The power module includes a first bridge arm and a second bridge arm. The first bridge arm includes a first semiconductor device and a second semiconductor device. The first semiconductor device and the second semiconductor device are connected to each other and disposed adjacently. The second bridge arm includes a third semiconductor device and a fourth semiconductor device. The third semiconductor device and the fourth semiconductor device are connected to each other and disposed adjacently. The first and the third semiconductor devices are symmetrically disposed, and the second and the fourth semiconductor devices are symmetrically disposed between the first and the third semiconductor devices. The power module is perpendicularly disposed on the circuit board.

Yet a further aspect of the disclosure provides a method for fabricating a power module. The method includes: symmetrically arranging a first semiconductor device and a second semiconductor device on a substrate; symmetrically arranging a third semiconductor device and a fourth semiconductor device on the substrate; and symmetrically directing a first common pin and a second common pin from the same side of the substrate. The first and the third semiconductor devices are connected with each other through the first common pin and disposed adjacently, and the second and the fourth semiconductor devices are connected with each other through the second common pin and disposed adjacently.

BRIEF DESCRIPTION OF THE DRAWINGS

FIG. 7C is a schematic internal structure diagram of a power module according to a third embodiment of the disclosure;

FIG. 8 is a schematic partial cross-sectional structure view of a packaged power module according to an embodiment of the disclosure;

FIG. 16A is a schematic view of a power system according to an embodiment of the disclosure;

FIG. 16C is a schematic view of a power system according to a further embodiment of the disclosure.

DETAILED DESCRIPTION

The disclosure will be described in details in the following embodiments with reference to the accompanying drawings. However, the embodiments described are not intended to limit the disclosure. Moreover, it is not intended for the description of operation to limit the order of implementation. Any device with equivalent functions that is produced from a structure formed by a recombination of elements shall fall within the scope of the disclosure. Moreover, the appending drawings are only used for illustration and are not drawn to scale. For convenience of understanding, the same reference numbers represents the same elements in the following description.

Terms used throughout the specification and the claims often have the general meaning of each term used in the art, the disclosure and a specific to content, unless otherwise stated specifically. Some terms used for describing the disclosure will be discussed hereafter or at other places of the specification, so as to provide additional guiding with respect of the description of the disclosure for those of skills in the art.

The terms "about", "approximately" or "substantially " used herein generally refer to a numeral error or scope within 20%, preferably within 10%, and more preferably within 5%. If it is not sated explicitly, the referred numbers are all regarded as approximate values with for example the error or scope represented by the terms "about", "approximately" or "substantially" or other approximate values.

The terms "first", "second" and the like used herein are neither intended to specifically designate a sequence or order nor intended to limit the disclosure, and are only used to identify elements or operations described through the same technical terms.

Furthermore, the terms "include", "comprise", "have", "contain" are all open-ended terms, meaning including but not limited to.

Additionally, the terms "coupling" or "connecting" used herein both refer to that two or more elements physically or electrically contact with each other directly or indirectly, or refer to that two or more elements inter-operate or interact with each other.

Figure 1:
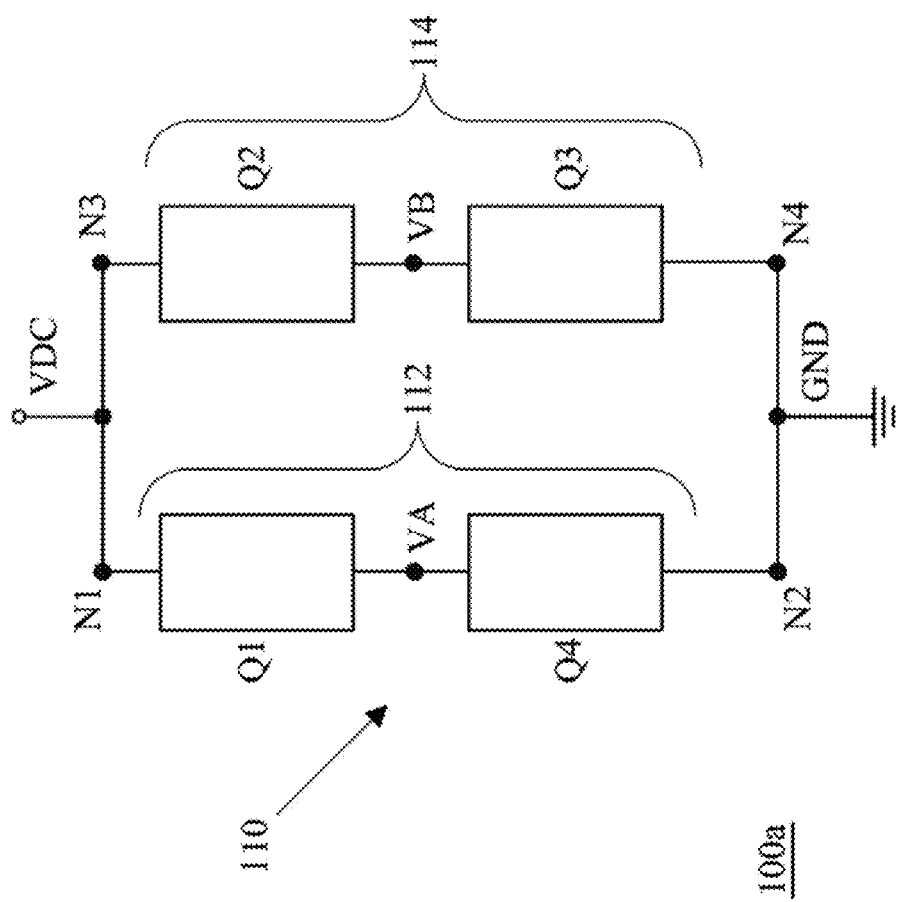
FIG. 1 is a schematic circuit block diagram of a power module according to an embodiment of the disclosure.

FIG. 1 is a schematic circuit block diagram of a power module according to an embodiment of the disclosure. As shown in FIG. 1, a power module 100a includes a bridge circuit (e.g., full bridge circuit) 110. The bridge circuit 110 includes a first bridge arm 112 and a second bridge arm 114. The first bridge arm 112 has terminals N1, N2 and VA. The first bridge arm 112 includes two semiconductor devices Q1 and Q4 electrically connected to the terminal VA. In particular, the semiconductor devices Q1 and Q4 are cascade connected with each other to the terminal VA. Furthermore, the second bridge arm 114 has terminals N3, N4 and VB. The second bridge arm 114 includes two semiconductor devices Q2 and Q3 electrically connected to the terminal VB. In particular, the semiconductor devices Q2 and Q3 are cascade connected with each other to the terminal VB. Moreover, the first bridge arm 112 and the second bridge arm 114 are connected in parallel between a voltage terminal VDC and a ground terminal GND, and the circuit positions of the first bridge arm 112 and the second bridge arm 114 are substantially symmetric with each other to reduce the voltage spikes or reduce the difference of the voltage spikes generated during operations of the semiconductor devices Q1, Q2, Q3 and Q4, which are described specifically hereafter.

In an embodiment, at least two or all of the semiconductor devices Q1, Q2, Q3 and Q4 are active devices; in another embodiment, the semiconductor devices Q1 and Q4 of the first bridge arm 112 are active devices, or the semiconductor devices Q2 and Q3 of the second bridge arm 114 are active devices; and in a further embodiment, at least one of the semiconductor devices Q1 and Q4 of the first bridge arm 112 is an active device, or at least one of the semiconductor devices Q2 and Q3 of the second bridge arm 114 is an active device. In actual conditions, the aforementioned active device may be a metal oxide semiconductor field effect transistor (MOSFET), an insulated gate bipolar transistor (IGBT), a silicon carbide (SiC) power transistor, a gallium nitride (GaN) power transistor, a semiconductor device with a cascade structure or active devices of other types.

Figure 2:
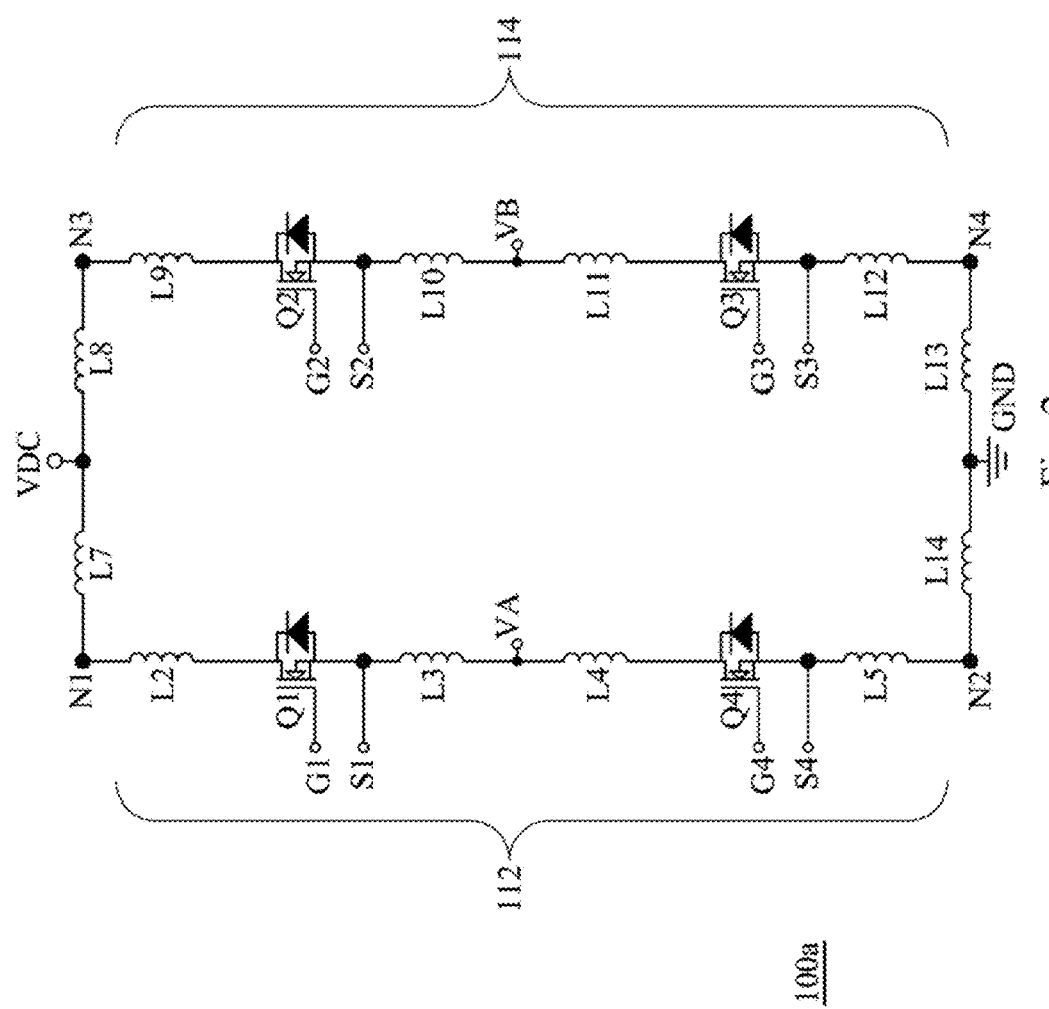
FIG. 2 is a schematic circuit diagram of the power module shown in FIG. 1 according to an embodiment of the disclosure.

FIG. 2 is a schematic circuit diagram of the power module shown in FIG. 1 according to an embodiment of the disclosure. As shown in FIG. 2, inductances may further exist among the aforementioned semiconductor devices Q1, Q2, Q3 and Q4 (e.g., equivalent inductances L2-L5 and L7-1-l14 shown in FIG. 2). In the power module 100a, the semiconductor devices Q1, Q2, Q3 and Q4, or the devices and the power source are mainly connected correspondingly through conductors (such as, bonding wires, copper wires, lead frames or traces on a circuit board), so that various parasitic inductances are existed in the circuit (e.g., the equivalent inductances L2-L5 and L7-L14 as shown in FIG. 2).

Additionally, the aforementioned first bridge arm 112 or second bridge arm 114 may be connected in parallel with a DC power source. That is, the voltage between the voltage terminal VDC and the ground terminal GND is a DC input voltage. Generally, for designing of a bridge circuit module, the function of distributed inductances which affect actual operating performance should be taken into consideration. Taking the first bridge arm 112 as an example, the two semiconductor devices Q1 and Q4 on the first bridge arm 112 cannot be turned on simultaneously, otherwise the devices may be burned down due to too large current caused by shoot through. Furthermore, since the semiconductor devices Q1 and Q4 are in series connected with each other and connected in parallel with the DC power source, in a desirable condition after any one of the semiconductor devices Q1 and Q4 is turned off, the turn-off voltage thereof is clamped to the DC power source by the other device, and thus the voltage peak generated by any device does not exceed that of the DC power source, to enable the semiconductor devices Q1 and Q4 to operate to reliably.

Figure 3:
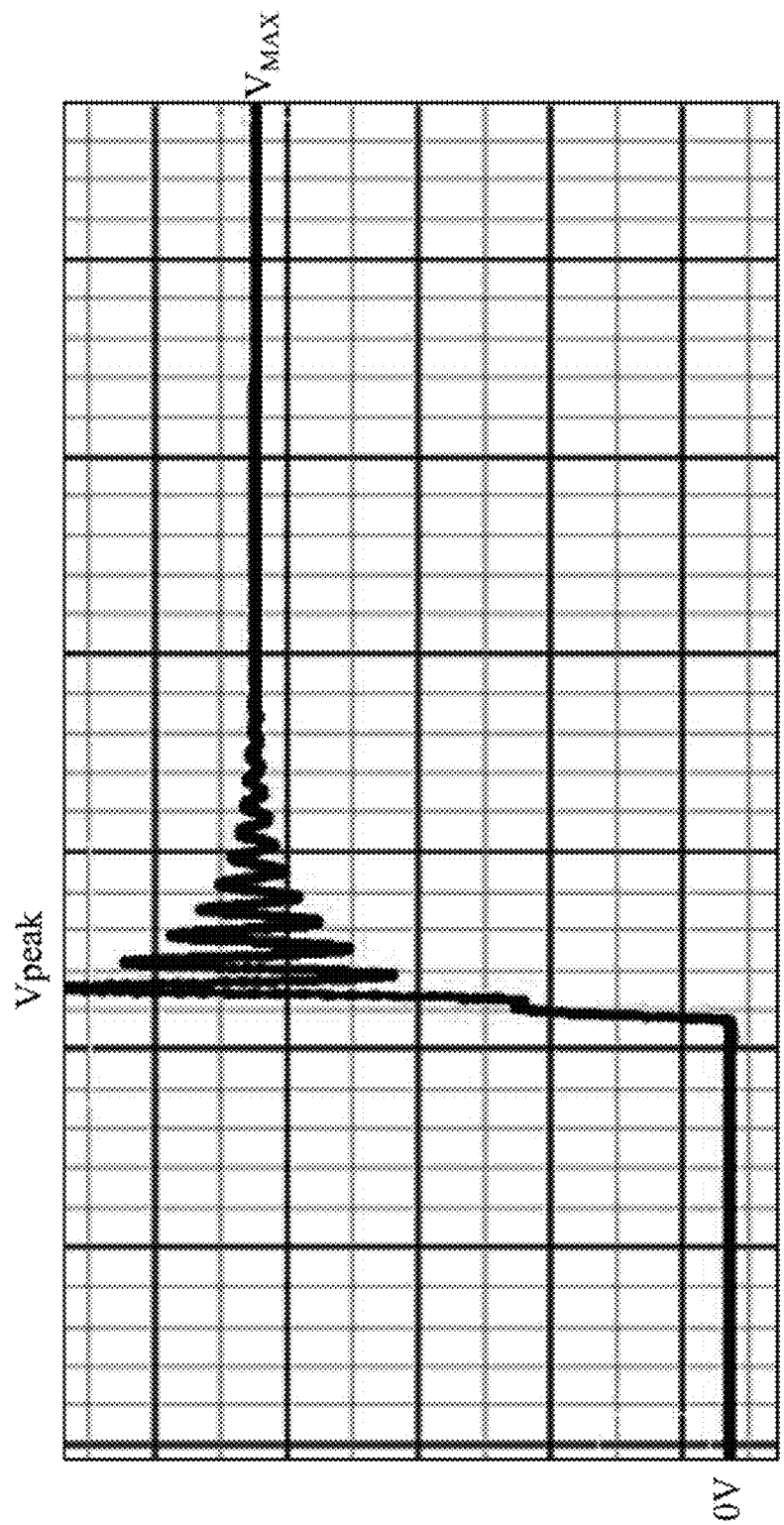
FIG. 3 is a schematic waveform graph of turnoff voltages of a semiconductor device during turn-off operation thereof according to an embodiment of the disclosure.

Additionally, parasitic inductances in the circuit described above reduce the capability of two devices connected in series in the same bridge arm of the power module for helping clamp each other, which generates voltage spikes or peaks when a turn-off operation is performed on the devices. This not only affects the reliability of the power module, but also causes various electromagnetic interferences. Moreover, the greater the parasitic inductance is, the greater the voltage spike (or peak) generated during the turn-off operation of the devices is. FIG. 3 is a schematic waveform graph of turn-off voltages of a semiconductor device during turn-off operation thereof according to an embodiment of the disclosure. Taking the semiconductor device Q1 (e.g., the MOSFET) as an example, when the semiconductor device Q1 is turned on, the voltage between two ends of the semiconductor device Q1(i.e., the voltage between drain and source electrodes) is zero; and when the semiconductor device Q1 is turned off, the voltage between two ends of the semiconductor device Q1 is first increased from zero to the highest turn-off voltage Vpeak and then decreased to a steady-state value (i.e., a turn-off platform voltage $V_{MAX}$) through oscillation, wherein $V_{MAX}$ is generally the voltage of the voltage terminal VDC shown in FIG. 2, and the amplitude value of the high frequency oscillation in the period from the start of turn-off to the steady state is the difference value between Vpeak and $V_{MAX}$.

According to the previous description, in the embodiments of the disclosure, the circuit positions of the first bridge arm 112 and the second bridge arm 114 are substantially symmetric with each other, and the circuit positions of the semiconductor devices Q1 and Q4 of the first bridge arm 112 are also to symmetric with the semiconductor devices Q2 and Q3 of the second bridge arm 114. Therefore, the loop inductances corresponding to the two bridge arms 112 and 114 are symmetric with each other, and thus the turn-off voltages corresponding to the semiconductor devices of the two bridge arms 112 and 114 are also symmetric with each other, and also the turn-off voltage peaks are also systematic, to reduce the electromagnetic interference to the power module 100a and reduce the influence on the circuit, thereby enabling the power module 100a to exhibit the optimal performance. For example, in general, if the amplitude difference value of the high frequency oscillation of the turn-off voltages of the two upper and lower semiconductor devices of each bridge arm is less than 20% of the oscillation amplitude value, it can be considered that the circuit position of the two bridge arms are symmetric. However, it is better for the amplitude difference value to become smaller, for example less than 10% of the oscillation amplitude value.

Furthermore, in another embodiment, as shown in FIG. 2, the semiconductor devices Q1, Q2, Q3 and Q4 respectively have a control pin (e.g., pins G1, G2, G3 and G4) and a driving pin (e.g., pins S1, S2, S3 and S4). The aforementioned control pin can cooperate with the driving pin to receive driving signals for driving corresponding semiconductor devices to be turned on and further determine turn-on or turn-off of each semiconductor device. Moreover, in the following different embodiments, the semiconductor devices Q1, Q2, Q3 and Q4 may also be provided optionally with driving pins according to practical demands, without being limited by the drawings.

Specifically, when the circuit structure in the power module 100a is symmetric and the distribute parameter is reduced, it means that the corresponding semiconductor device may have a lower turn-off voltage peak, which further improves the switching speed and ensures that the devices are operated safely while the switching loss is reduced. However, taking the semiconductor device Q1 as an example, due to the existence of parasitic inductance L3, if the pins of the power module 100a do not include the pin S1, the driving signal of the semiconductor device Q1 is obtained through the pins G1 and VA. That is, the driving signal of the semiconductor device Q1 is equal to a sum of the voltage VG1-VA between the pins G1 and VA and the voltage of the inductance L3. It can be seen that the voltage of the inductance L3 has a counteracting effect on the VG1-VA, i.e., reducing the switching speed of the semiconductor device Q1. Therefore, due to the existence of the inductance L3, the switching speed cannot be improved as expected, and thus the actual benefit obtained is reduced after the loop inductance is effectively decreased.

Accordingly, if each of the aforementioned semiconductor devices has a control pin (G) and a driving pin (S), then since the driving pin (S) can be independently applied for driving of the semiconductor device, during the switching period the inductance L3 is no longer having influence on the switching speed to further improve the switching speed, and the driving signal obtained by the power module 100a becomes more pure and not easy to be interfered by temperature, speed and the like to improve reliability of the entire circuit.

Figure 4:
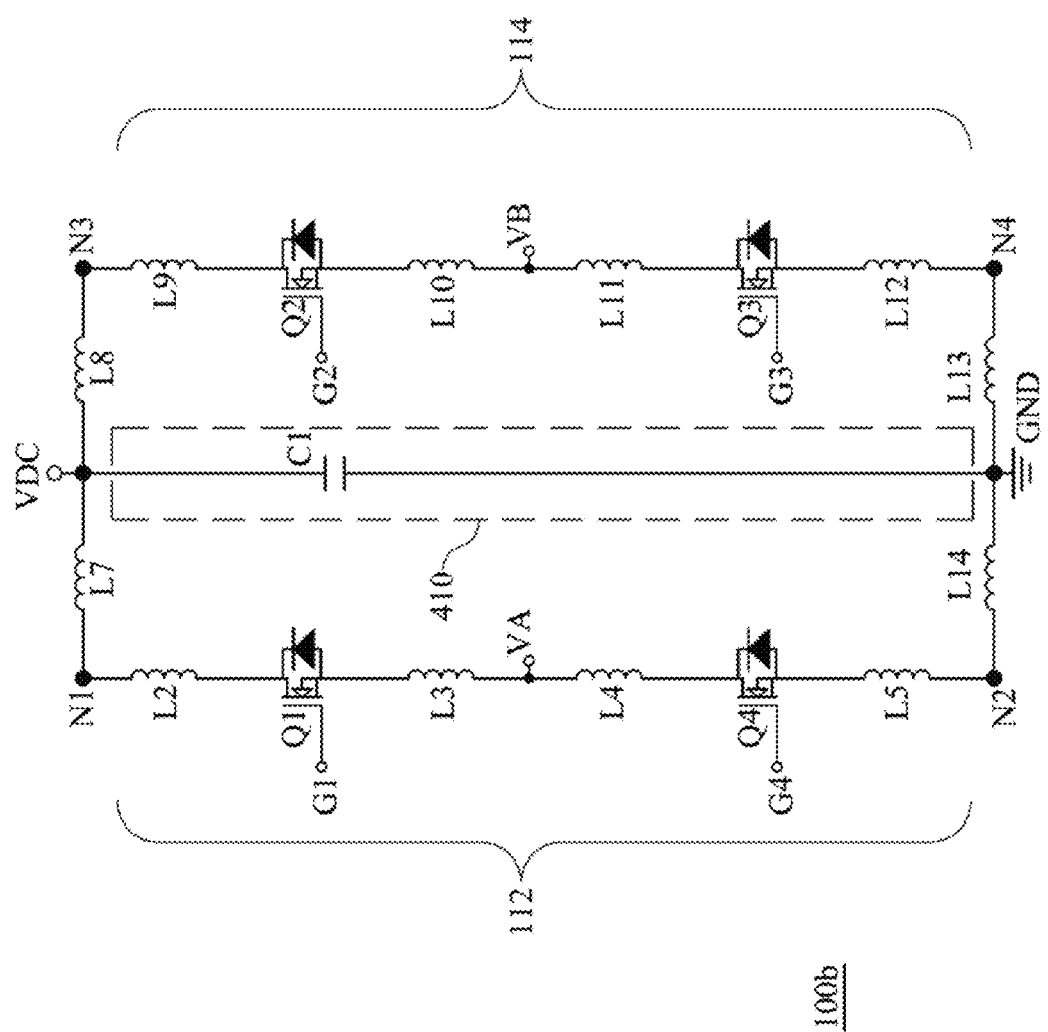
FIG. 4 is a schematic circuit diagram of a power module according to another embodiment of the disclosure.

FIG. 4 is a schematic circuit diagram of a power module according to an embodiment of the disclosure. Compared with the embodiment shown in FIG. 2, a power module 100b shown in FIG. 4 further includes a capacitance bridge arm 410. The capacitance bridge arm 410 is positioned between the power source terminal VDC and the ground terminal GND and is connected in parallel with the first bridge arm 112 and the second bridge arm 114 to reduce the influence caused by the parasitic inductance in the loop.

In an embodiment, the circuit position of the capacitance bridge arm 410 relative to the first bridge arm 112 is substantially symmetric with that of the capacitance bridge arm 410 relative to the second bridge arm 114, so as to reduce the difference between the voltage spikes respectively generated during operations of the first bridge arm 112 and the second bridge arm 114.

As shown in FIG. 4, the capacitance bridge arm 410 may include a capacitor C1 (e.g., a decoupling capacitor). The capacitor C1 is connected in parallel with the first bridge arm 112 and the second bridge arm 114, and is disposed at a intermediate circuit position relative to the first bridge arm 112 and the second bridge arm 114, so that the power module 100b still has a symmetric circuit structure, and the influence caused by the parasitic inductance in the loop can be reduced by the capacitor C1.

Furthermore, the first bridge arm 112 and the capacitance bridge arm 410 form a first loop, and the second bridge arm 114 and the capacitance bridge arm 410 form a second loop. The inductance value of the first loop (the inductance value is a sum of respective inductances in the first loop, including the sum of the inductance values of inductances L2-L5, L7 and L14) and/or the inductance value of the second loop (the inductance value is a sum of respective inductance values in the second loop, including the sum of the inductance values of inductances L8-L13) are less than a first predetermined value. The first predetermined value can be adjusted adaptively for different to applications. For example, when being applied in a 600 V power module of a 3 KW power source, the first predetermined value may be 30 nH, and preferably below 20 nH.

In an embodiment, the circuit positions of the first bridge arm 112 and the second bridge arm 114 are substantially symmetric with each other, and the circuit positions of the semiconductor devices Q1 and Q4 in the first bridge arm 112 and the semiconductor devices Q2 and Q3 in the second bridge arm 114 are also symmetric with each other, so that the inductance of the first loop may substantially be the same with that of the second loop.

In another embodiment, the inductances of the aforementioned first loop and second loop may be different with each other, and since the circuit positions of the semiconductor devices Q1 and Q4 in the first bridge arm 112 and the semiconductor devices Q2 and Q3 in the second bridge arm 114 are also symmetric with each other, the inductance difference value between the inductances of the aforementioned first loop and second loop may be less than a second predetermined value. The second predetermined value can be adjusted adaptively for different application conditions. For example, when being applied in a 600 V power module of a 3 KW power source, the second predetermined value may be 10 nH, and preferably below 5 nH. The second predetermined value may vary along with the change of actual conductor connection manners.

Figure 5:
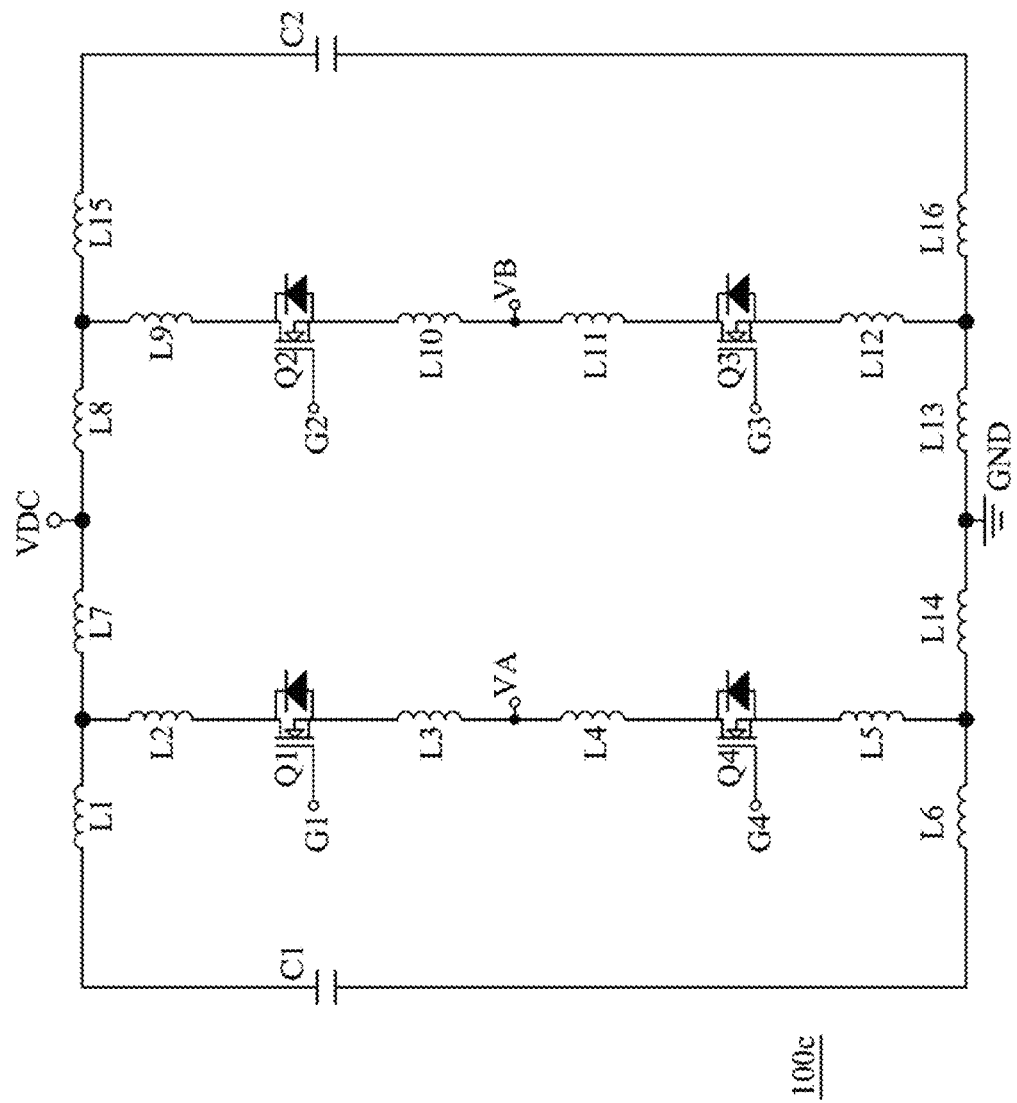
FIG. 5 is a schematic circuit diagram of a power module according to a further embodiment of the disclosure.

FIG. 5 is a schematic circuit diagram of a power module according to another embodiment of the disclosure. Compared with the embodiment shown in FIG. 2, a power module 100c shown in FIG. 5 may further include two symmetric capacitance bridge arms. The two capacitance bridge arms respectively include capacitors C1 and C2. The two capacitors C1 and C2 are respectively connected in parallel with the first bridge arm (including the semiconductor devices Q1 and Q4) and the second bridge arm (including the semiconductor devices Q2 and Q3), and are disposed at substantially symmetric circuit positions relative to the first bridge arm and the second bridge arm. Specifically, the capacitor C1 is positioned between the power source terminal VDC and the ground terminal GND, and is connected in parallel with the semiconductor devices Q1 and Q4; the capacitor C2 is positioned between the power source terminal VDC and the ground terminal GND, and is connected in parallel with the semiconductor devices Q2 and Q3; and the two capacitors C1 and C2 are disposed symmetrically in the circuit structure. The capacitor C1 is disposed at an outer side of the first bridge arm, and the capacitor C2 is disposed at an outer side of the second bridge arm. The position relation between the capacitor C1 and the first bridge arm is symmetric with the position relationship between the capacitor C2 and the second bridge arm. For simplification of application, the two capacitors C1 and C2 may be disposed in the power module to maximize the performance; and the two capacitors C1 and C2 may also be disposed on the outer portion of the power module (for example on the printed circuit board) to be connected adjacently with corresponding pins of the power module. That is, the capacitor C1 is connected adjacently with a power source terminal pin and a ground terminal pin at the same side, and the capacitor C2 is connected adjacently with a power source terminal pin and a ground terminal pin at the other side.

Figure 6:
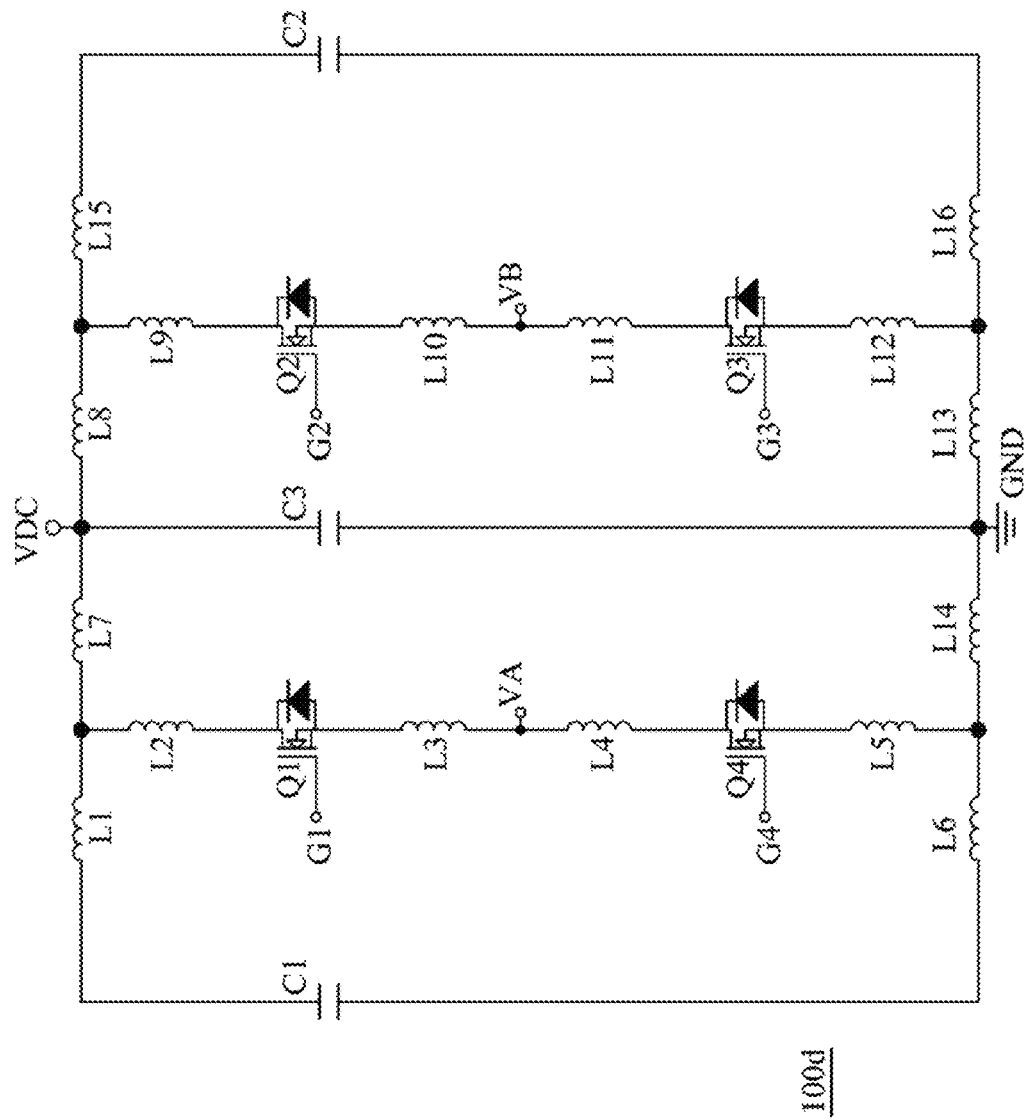
FIG. 6 is a schematic circuit diagram of a power module according o a further embodiment of the disclosure.

FIG. 6 is a schematic circuit diagram of a power module according to another embodiment of the disclosure. Compared with the embodiment shown in FIG. 5, a power module 100d shown in FIG. 6 may further include another capacitance bridge arm. The capacitance bridge arm may further include a capacitor C3. The capacitor C3 is connected in parallel with the first bridge arm (including the semiconductor devices Q1 and Q4) and the second bridge arm (including the semiconductor devices Q2 and Q3), and is disposed at an intermediate circuit position between the first bridge arm and the second bridge arm. The capacitors C1 and C2 are disposed at substantially symmetric circuit positions to enable the power module 100d to have a symmetric circuit structure.

The power module and/or the bridge circuit applied therein as described in the aforementioned embodiments both can be disposed in, but not limited to an AC-to-DC (AC/DC) circuit, a DC-to-AC (DC/AC) circuit, a DC-to-DC (DC/DC) circuit, an AC-to-AC circuit, a bi-directional power transmission circuit or other similar power conversion circuit, according to practical demands. The aforementioned bridge circuit can be applied in a circuit only having unidirectional flowing power or a circuit having bi-directional transmitting power. Moreover, since all the paths for power conversion in the aforementioned bridge circuit can be operated together with active semiconductor devices, which means in an ideal condition (for example when a MOSFET having very low internal resistance is applied), both very low turn-on state loss and very high conversion efficiency can be realized, and the bridge circuit generally can be widely applied.

Figure 7A:
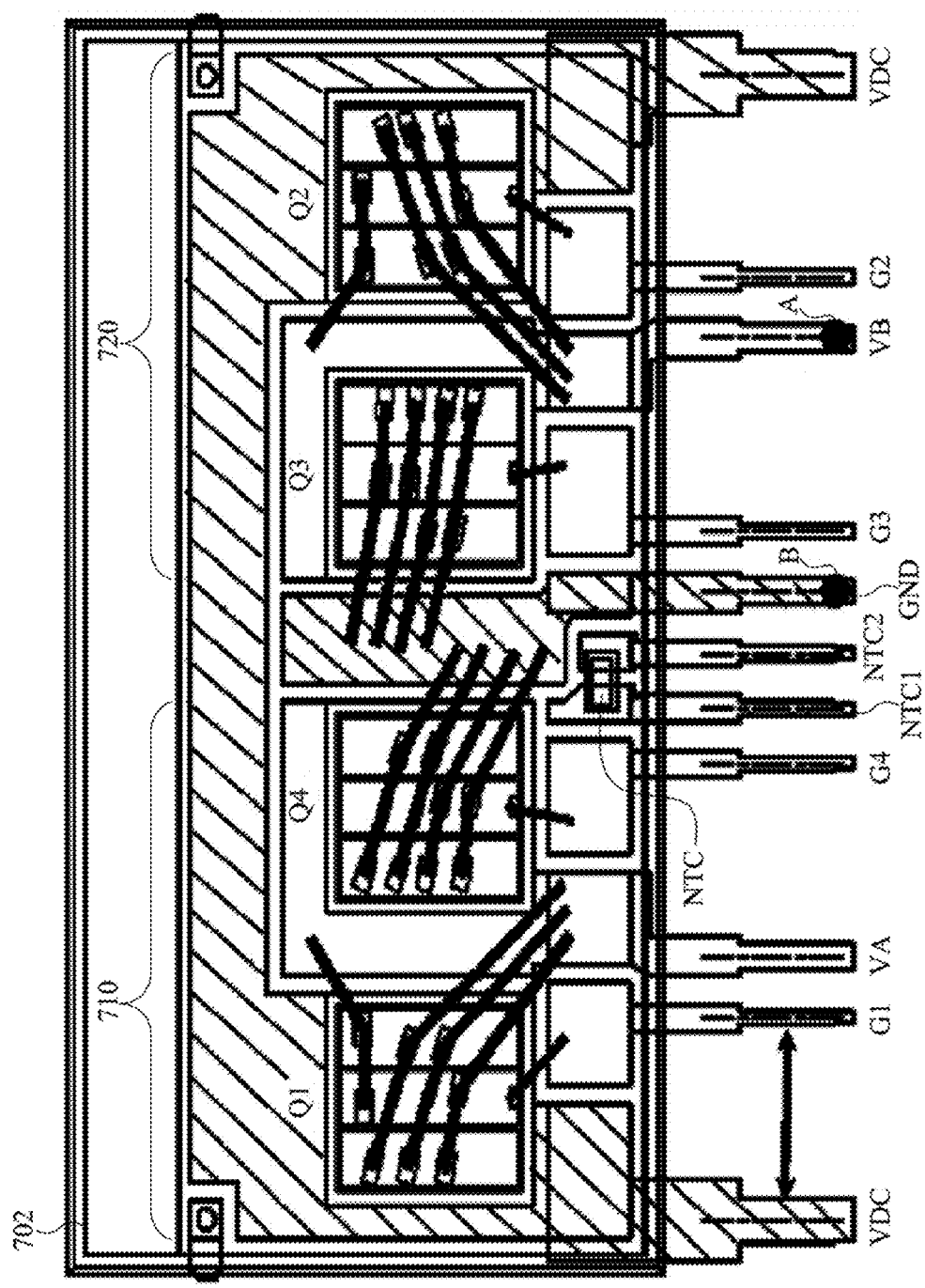
FIG. 7A is a schematic internal structure diagram of a power module according to a first embodiment of the disclosure.

A power module of another implementation aspect of the disclosure is described hereafter. FIG. 7A is a schematic internal structure diagram of a power module according to an embodiment of the disclosure. As shown in FIG. 7A, a power module 700a includes a substrate 702 (e.g., a ceramic substrate), common pins VA and VB, a first bridge arm 710 and a second bridge arm 720. The first bridge arm 710 and the second bridge arm 720 are both disposed on the substrate 702. The first bridge arm 710 includes semiconductor devices Q1 and Q4, and the semiconductor devices Q1 and Q4 are connected in series with each other through the common pin VA and are disposed adjacently. The second bridge arm 720 includes semiconductor devices Q2 and Q3, and the semiconductor devices Q2 and Q3 are connected in series with each other through the common pin VB and are disposed adjacently, to reduce the loop inductances of the first bridge arm 710 and the second bridge arm 720.

In practice, each of the semiconductor devices Q1, Q2, Q3 and Q4 may be fabricated in a form of chip, and be integrated in the power module 700a to connect with a pin or a lead frame through a bonding wire. Furthermore, taking the semiconductor device Q3 as an example, the measuring points at which the voltage peak thereof is measured are, for example, two points A and B shown in FIG. 7A (i.e., the top parts of the pin VB and GND).

Furthermore, the common pins VA and VB are symmetrically disposed at the same side of the substrate 702; the semiconductor devices Q1 and Q2 are symmetrically disposed: and the semiconductor devices Q4 and Q3 are also disposed symmetrically and are respectively disposed at the side of the semiconductor device Q1 and the side of the semiconductor device Q2. For example, as shown in FIG. 7A, the semiconductor devices Q4 and Q3 are disposed between the symmetric semiconductor devices Q1 and Q2, and are respectively disposed adjacently with the semiconductor devices Q1 and Q2, and the semiconductor devices Q4 and Q3 are also disposed symmetrically. It to should be noted that the term "symmetric" stated herein not only refers to symmetry in device positions, but also refers to symmetry in corresponding traces of the devices.

Furthermore, in an embodiment, the power module 700a may further include at least three groups of pins. These groups of pins and common pins VA and VB are all arranged abreast at the same side of the substrate 702. Two groups of the aforementioned pins having relatively large withstand voltages are respectively disposed symmetrically at two outermost positions at the same side of the substrate 702 (for example, two power source pins VDC are disposed symmetrically at two outmost sides), and one group of the aforementioned pins having the minimum withstand voltage is disposed at an intermediate position at the same side of the substrate 702 (for example, a group of pins including a pin GND is disposed at an intermediate position). Herein, the withstand voltage is referred to as the voltage difference between the group of pins and the ground pin GND.

In another embodiment, the power module 700a may include pins G1, G2, G3 and G4, two power source pins VDC and a ground pin GND, in which the pins G1, G2, G3, G4, VDC and GND, and the common pins VA and VB are disposed at the same side of the substrate 702. The pins G1, G2, G3 and G4 are respectively connected to the semiconductor devices Q1, Q2, Q3 and Q4 to receive control signals and determine turn-on and turn-off of respective semiconductor devices Q1, Q2, Q3 and Q4. The pins G1 and G2 are disposed symmetrically; the pins G3 and G4 are disposed symmetrically; and the pins G1 and G2 are respectively disposed adjacently with the common pins VA and VB, so that the pins G1 and VA form a group of pins having similar withstand voltages; the pins G2 and VB form a group of pins having similar withstand voltages; and the two groups of pins are symmetric with each other, as well as each pin in these groups.

Furthermore, two power source pins VDC are respectively disposed symmetrically at two outmost positions of the same side of the substrate 702 relative to the pins G1 and G2, being away from the pins G1 and G2. Moreover, the ground pin GND is disposed adjacently between the pins G3 and G4, so that the pins G3, G4 and GND form a group of pins disposed at an intermediate position of the same side of the substrate 702, and each of the pins have a similar withstand voltage.

In other embodiments, the power module 700a may only include a single power source pin VDC. The single power source pin VDC is disposed at an outmost position of the same side of the substrate 702 relative to the pins G1 and G2, and disposed away from the pins G1 and G2 at the same side of the substrate 702.

Additionally, in different embodiments, the power module 700a may further include a thermal sensitive resistance device (e.g., a resistor NTC with a negative temperature coefficient) and at least one temperature signal pin (e.g., temperature signal pins NTC1 and NTC2) (as shown in FIG. 7A). The resistor NTC is integrated on the substrate 702 for reflecting temperature variations, and the temperature signal pins NTC1 and NTC2 are connected to the resistor NTC to acquire signals reflecting internal temperatures of the power module 700a from the resistor NTC. Furthermore, the temperature signal pins NTC1 and NTC2 may be disposed adjacently between the pins G3 and G4, so that the to temperature signal pins NTC1 and NTC2, and the pins G3, G4 and GND form a group of pins having similar withstand voltages. In practice, the aforementioned thermal sensitive resistance device may be a device packaged in the power module 700a, or a device attached at the surface of the power module 700a.

Specifically, in order to perform thermal management inside the power module 700a more conveniently, the resistor NTC reflecting the temperature variations may be integrated in the power module 700a, and the corresponding temperature signal pins NTC1 and NTC2 are extended from the power module 700a, so that the signals reflecting the temperature variations can be collected through the temperature signal pins NTC1 and NTC2, to further acquire the internal temperature of the power module 700a.

In another embodiment, one of the aforementioned temperature signal pins (e.g., the pin NTC2) can also be configured to be the ground pin GND at the same time; in other words, the pins NTC2 and GND can be embodied as one pin. In practice, the speed of the operation of collecting signals from the aforementioned resistor NTC is very slow relative to the switching speed of devices inside the power module, and the temperature signals are similar to DC signals, so that when the temperature signal pin and the ground pin GND are embodied as one pin, it only needs to apply capacitance at a signal application terminal (generally an ND input end of a digital signal processor connected with the temperature signal pin or an input end of a comparator) to eliminate the effect of high-frequency power noise caused by the common pins, which not only saves space but also has no influence to operation.

Figure 7B:
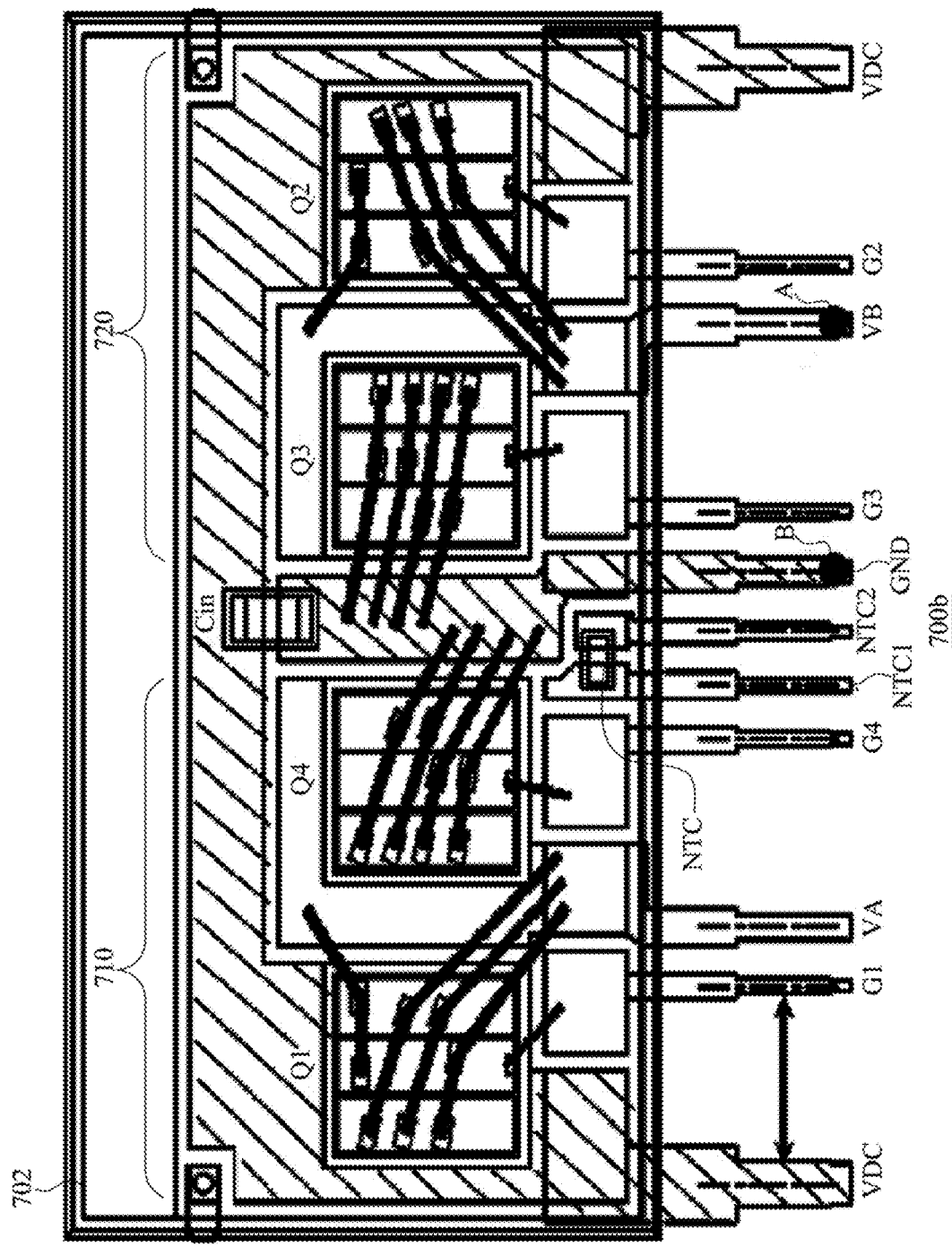
FIG. 7B is a schematic internal structure diagram of a power module according to a second embodiment of the disclosure.

FIG. 7B is a schematic internal structure diagram of a power module according to a second embodiment of the disclosure. Compared with FIG. 7A, a power module 700b shown in FIG. 7B further includes a capacitor Cin. The capacitor Cin is disposed at a relatively intermediate position between the semiconductor devices Q3 and Q4, and the connection manner and function thereof are similar to that of the capacitor C1 shown in FIG. 4. The relatively intermediate position refers to a scope of areas around the intermediate position, which means the difference of the distance between the capacitor Cin and the semiconductor device Q3 and the distance between the capacitor Cin and the semiconductor device Q4 is within a certain range, and most preferably the difference is zero.

For example, as shown in FIG. 7B, the capacitor Cin is disposed at an upper intermediate position between the semiconductor devices Q3 and Q4, so that the power module 700*b* has a symmetric structure. It should be noted that, the position of the capacitor Cin is not limited to that shown in FIG. 7B, and those of skills in the art can arrange the capacitor Cin at any intermediate position inside the power module 700*b* according to practical demands.

FIG. 7C is a schematic internal structure diagram of a power module according to a third embodiment of the disclosure. Compared with FIG. 7A, the power module 700*c* shown in FIG. 7C further includes driving pins S1, S2, S3 and S4. The driving pins S1, S2, S3 and S4 are respectively connected to the semiconductor devices Q1, Q2, Q3 and Q4, and are respectively configured to cooperate with the pins G1, G2, G3 and G4 to receive driving signals for driving corresponding semiconductor devices to be turned on, thereby determining turn-on and turn-off of each semiconductor device. Moreover, the driving pins S1 and S2 are disposed symmetrically; the driving pins S3 and S4 are disposed to symmetrically; the driving pin S1 is disposed adjacently between the pin G1 and the common pin VA; the driving pin S2 is disposed adjacently between the pin G2 and the common pin VB; the driving pin S3 is disposed adjacently between the pin G3 and the ground pin GND; and the driving pin 54 is disposed adjacently between the pin G4 and the ground pin GND, so that the pins G1, S1 and VA form a group of pins having similar withstand voltages; the pins G2, S2 and VB form a group of pins having similar withstand voltages; the pins G3, S3 and GND form a group of pins having similar withstand voltages; and the pins S4 and G4 form a group of pins having similar withstand voltages. In practice, the withstand voltage among respective groups of pins are very low, and generally may be less than 50 V, or even less than 30 V.

Additionally, since the withstand voltage among the pins G3, 53, GND, S4 and G4 is very low, these pins can be disposed adjacently to form a group of pins having similar withstand voltages. As such, the space can be utilized more effectively and the length of the power module is reduced, which makes the subsequent dimension design more convenient.

Furthermore, in other embodiments, the power module 700*c* also may include a thermal sensitive resistance device (e.g., the resistor NTC having a negative temperature coefficient) similar to the one described previously and at least one temperature signal pin (e.g., the temperature signal pins NTC1 and NTC2) for acquiring signals reflecting internal temperatures of the power module 700*c* from the resistor NTC. The temperature signal pins NTC1 and NTC2 may be disposed adjacently with the aforementioned pins G3, S3, GND, S4 and G4, so that the temperature signal pins NTC1 and NTC2, and the pins G3, S3, GND, 54 and G4 form a group of pins having similar withstand to voltages.

Figure 7D:
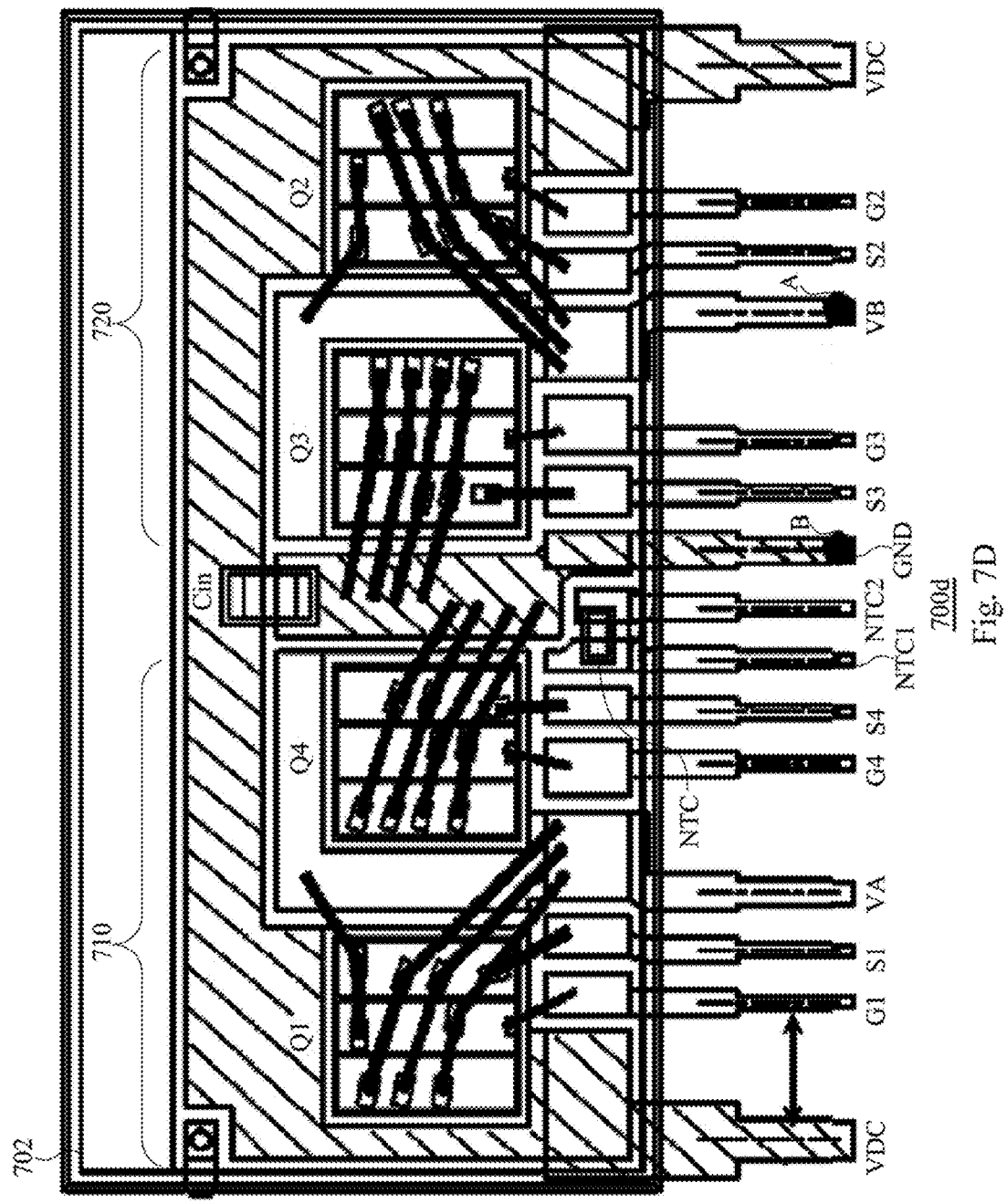
FIG. 7D is a schematic internal structure diagram of a power module according to a fourth embodiment of the disclosure.

FIG. 7D is a schematic internal structure diagram of a power module according to a fourth embodiment of the disclosure. Compared with FIG. 7C, a power module 700*d* shown in FIG. 7D further includes a capacitor Cin. The capacitor Cin is disposed at a relatively intermediate position between the semiconductor devices Q3 and Q4, and the connection manner and function thereof are similar to that of the capacitor C1 shown in FIG. 4. Similarly, the position of the capacitor Cin is not limited to that shown in FIG. 7D, and those of skills in the art can dispose the capacitor Cin at any intermediate position inside the power module 700*d* according to practical demands.

It can be seen from the aforementioned embodiments that the aforementioned arrangement manner is applied to mainly arrange all the output pins at the same side of the module, and the pins among which the withstand voltage is relatively low is disposed adjacently to form a pin combination. Furthermore, a pin distance (i.e., the minimum distance between portions of the two pins which can directly contact a bonding pad of a user board) is defined according to the requirement of withstand voltage among the pins, and thus the pins are arranged with unequal intervals. That is, the distance among pins having high withstand voltage is designed relatively large, and the distance among pins having low withstand voltage is designed relatively small, so as to utilize the space as much as possible to realize effective use of space. In other words, a low loop inductance and a small dimension can be practiced without increasing more fabricating costs. In practice, the distance between the two pins is generally determined by installation manners and a layout. When the withstand voltage is below 200 V the distance is approximately from to 0.8 mm to 3 mm; when the withstand voltage is from 200 V to 600 V, the distance is approximately from 2 mm to 5 mm; and when the withstand voltage is from 600 V to 1200 V, the distance is approximately from 4 mm to 10 mm.

Furthermore, according to the aforementioned embodiments, the pins having relatively low withstand voltage are disposed adjacently, which reduces the loop inductance, and this arrangement manner also makes it easy to dispose the position of the decoupling capacitor, so as to simply realize the symmetric distribution of parasitic inductances, to reduce the electromagnetic interference, reduce the influence to the circuit and enable the power module to exhibit the optimal performance.

FIG. 8 is a schematic partial cross-sectional structure view of a packaged power module according to an embodiment of the disclosure. As shown in FIG. 8, a semiconductor device 802 may be any of the aforementioned semiconductor devices Q1, Q2, Q3 and Q4, and is connected with other devices through a bonding wire 804. The semiconductor devices Q1, Q2, Q3 and Q4, and the bonding wire thereon (e.g., the bonding wire 804) are all covered by a molding material 806, and the thermal conductivity coefficient of this molding material is greater than 1 W/(m·K). The molding material 806 covers the devices to form the main profile of the package body.

In an embodiment, the molding material 806 disposed above the semiconductor device 802 (i.e., any one of the aforementioned semiconductor devices Q1, Q2, Q3 and Q4) has a thickness d1 less than 2 millimeters (mm).

In another embodiment, the molding material 806 disposed above the bonding wire 804 connected on the semiconductor device 802 has a thickness d2 less than 0.5 millimeters. It should be noted that the values of the thicknesses d1 to and d2 are not limited to those stated previously, and those of skills in the art can select and adjust the values of the thicknesses d1 and d2 according to practical demands.

The power module of the aforementioned embodiments can be applied in a power converter, and the power density and the highest efficiency of the power converter may be respectively greater than 25 w/inch$^3$ and higher than 95%, or alternatively the power density of the power converter may be greater than 30 w/inch$^3$, or alternatively the highest efficiency of the power converter may be higher than 96%.

In an embodiment of the disclosure, the power module applied in a power converter, and the power density and the highest efficiency of the power converter are respectively greater than 30 w/inch$^3$ and higher than 96%, or alternatively the power density of the power converter is greater than 35 w/inch$^3$, or alternatively the highest efficiency of the power converter is higher than 97%.

The embodiments of the disclosure can be applied to effectively reduce the loop inductance and the switching loss of the circuit, which is more appropriately for improving the operating efficiency. For example, the frequency of the described power converter is improved above 50 kHz, or above 100 kHz, or even above 200 kHz, so as to realize a greater power density while the high efficiency is ensured.

Figure 9:
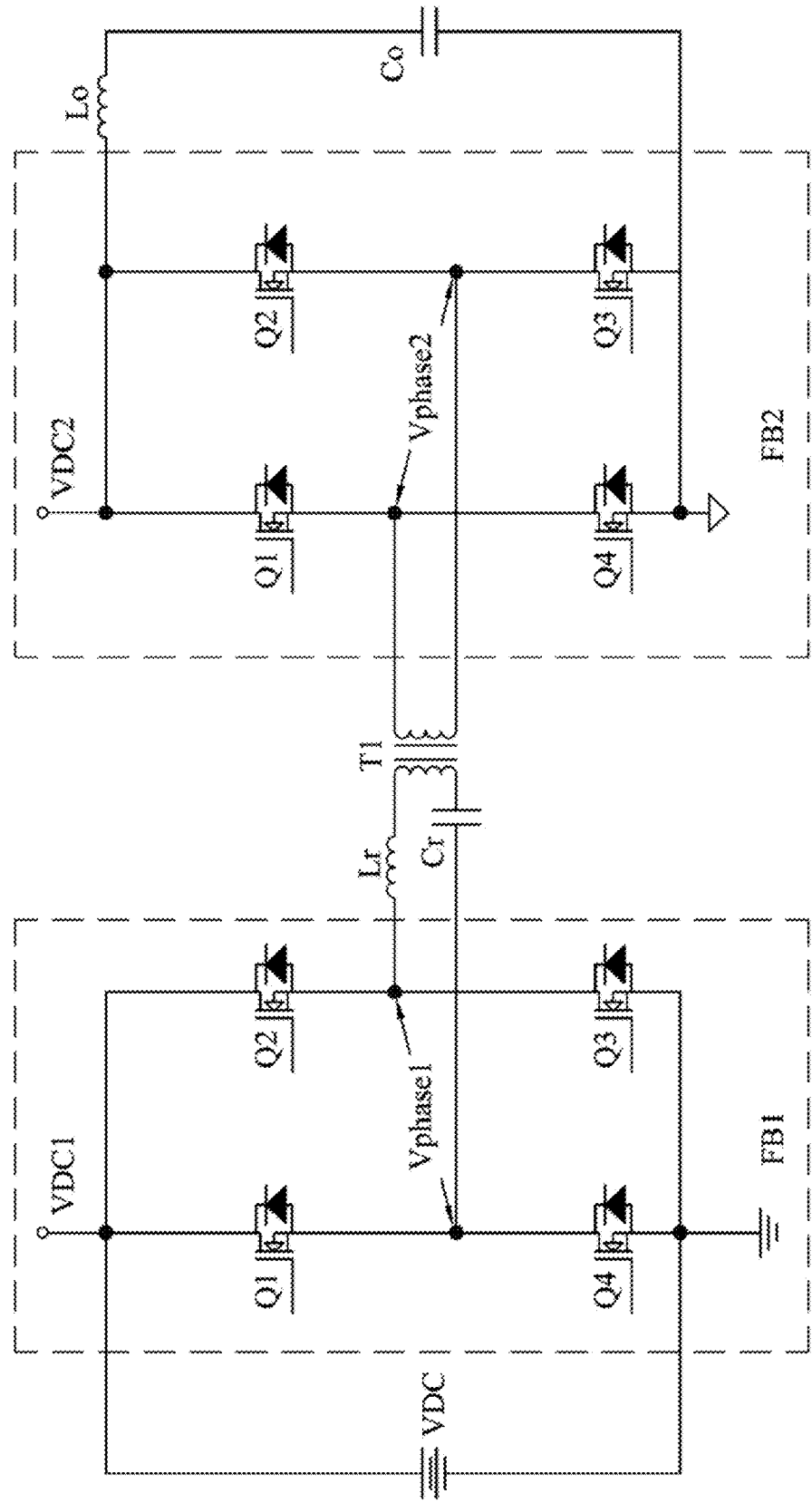
FIG. 9 is a schematic view of an isolated DC/DC conversion circuit according to an embodiment of the disclosure.

The power module of the aforementioned embodiments and the bridge circuit (e.g., a full bridge circuit) therein can be applied in an isolated DC/DC conversion unit. FIG. 9 is a schematic view of an isolated DC/DC conversion circuit according to an embodiment of the disclosure. As shown in FIG. 9, a full bridge circuit FB1 can convert a DC voltage VDC into a high-frequency AC signal Vphase1 through high-frequency operation, and then the high-frequency AC signal Vphase1 is converted to a high-frequency AC signal Vphase2 through an inductance Lr, a capacitor Cr and a transformer T1. Moreover, a rectifier (e.g., a full bridge circuit FB2) rectifies the signal Vphase2 to another DC voltage and then outputs the DC voltage at two ends of a capacitor Co through a filter inductance Lo.

According to different designing requirements, the full bridge circuit FB1 can operate in a pulse width modulation (PWM) mode (taking a phase shift full bridge PSFB as a typical circuit, it requires that Lr is small and Lo is large), or operate in a pulse frequency modulation (PFM) mode (taking LLC as a typical circuit, it requires that Lr is large and Lo approaches zero, and Lr and Cr form a resonant slot of a resonant circuit). Furthermore, the full bridge circuit FB2 is used as a rectifier, and the switching devices therein operate in a synchronous rectification mode.

In practice, by using an optimized full bridge circuit, a high-performance DC/DC conversion circuit can be realized, and by incorporating the power module of the embodiments of the disclosure, after the full bridge circuit FB1 is used or after the full bridge circuits FB1 and FB2 are used simultaneously, a high-efficiency power conversion can be realized well, in which a DC/DC conversion efficiency of 97%-98% can be achieved under the PWM mode, and a DC/DC conversion efficiency of 98%-99% can even be achieved under the PFM mode, as well as a high power density.

On the other hand, when the embodiments of the disclosure are applied in an isolated AC/DC power conversion circuit (i.e., a front stage with power factor correction (PFC) circuit), the power density of the conversion circuit may also greater than 25 w/inch$^3$, or even greater than 30 w/inch$^3$, or more even greater than 40 w/inch$^3$, and the highest efficiency of the conversion circuit may be greater than 96%, or even up to 98%.

As shown in FIG. 9, when the devices Q1-Q4 of the full bridge circuit are all switching devices, it can be achieved that the power are bi-directional flowing for these devices, which is appropriate for conditions that needs both bi-directional flowing power and high-voltage isolation (e.g., a converter for converting high-voltage power and low-voltage power of a vehicle battery). Additionally, due to the bi-directional flowing power, a diode connected in parallel with the switching device should have an excellent backward recovery property, and thus new devices (e.g., a silicon carbide (SiC) device or transistor, or a gallium nitride (GaN) device or transistor) which have excellent performance similar to a body diode can also be applied in the circuit to enable the circuit to have excellent switching property, and meanwhile, to have excellent backward recovery property similar to a body diode.

Figure 10:
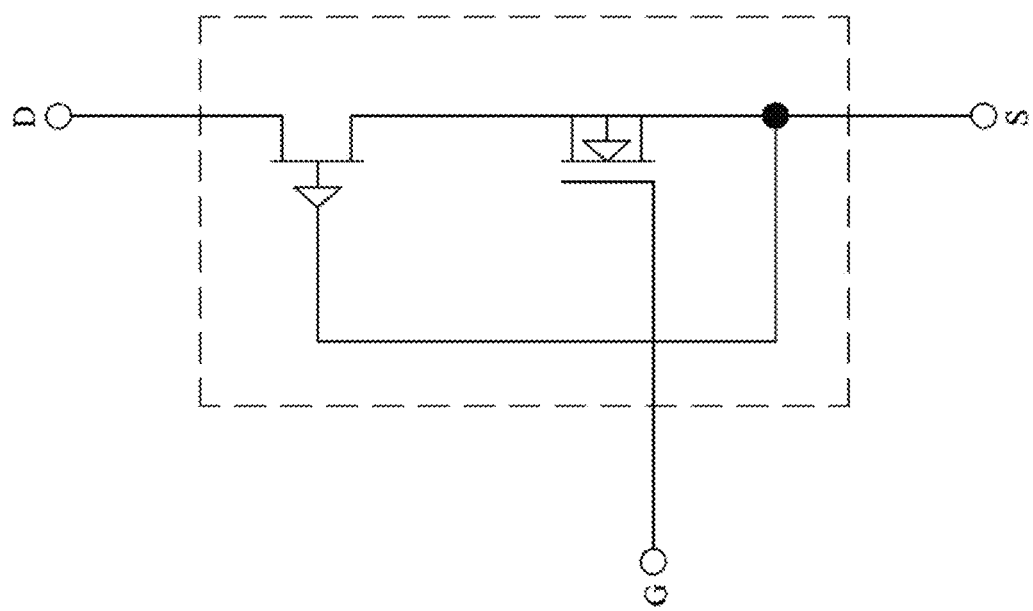
FIG. 10 is a schematic view of a switching unit circuit according to an embodiment of the disclosure.

The aforementioned SiC device or GaN device are generally divided into two types, which are normally-on and normally-off devices. When a normally-off device is used, since the control property thereof is similar to that of a device made of a conventional silicon material, the normally-off device can be directly used to replace the switching device of the power module. Additionally, since it is not suitable to directly use a normally-on device, the normally-on device is generally implemented by a cascade structure. FIG. 10 is a schematic view of a switching unit circuit according to an embodiment of the disclosure. As shown in FIG. 10, a normally-on device is connected in series with a low-voltage normally-off device to form a switching unit circuit, so that the switching unit circuit can achieve the control capability similar to the normally-off device while retaining the advantages of new devices.

Figure 11:
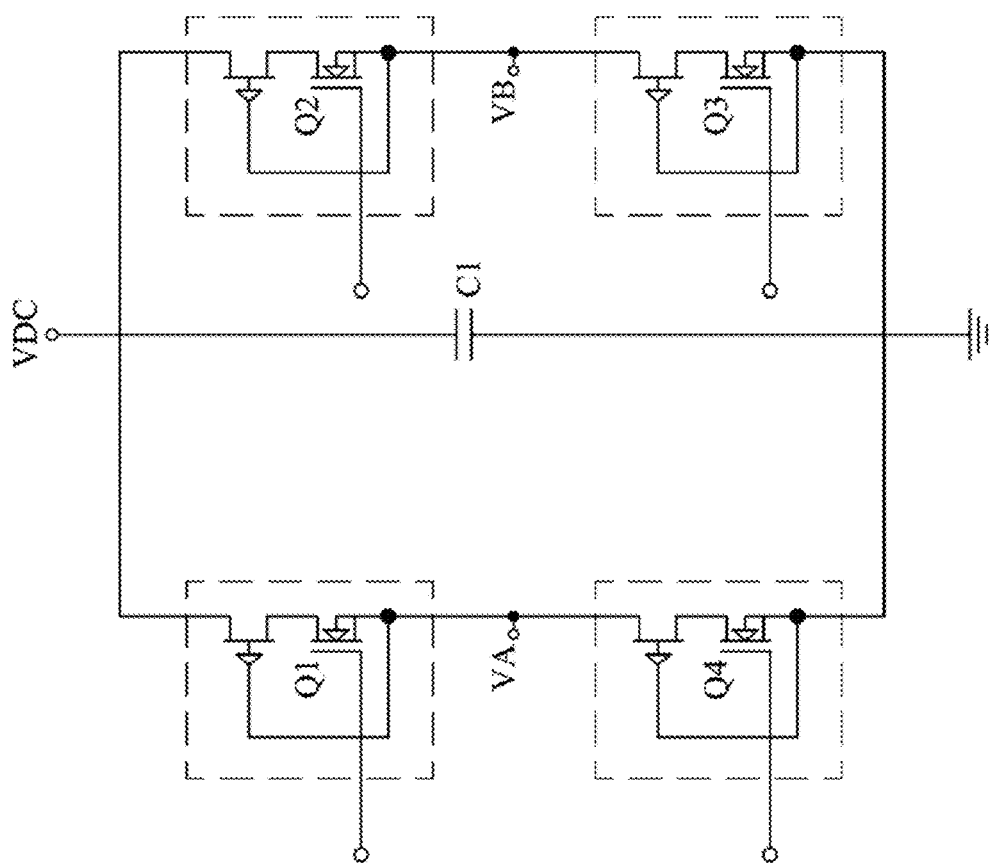
FIG. 11 is a schematic view of a full bridge power module according to an embodiment of the disclosure.

FIG. 11 is a schematic view of a full bridge power module according to an embodiment of the disclosure. As shown in FIG. 11, in this full bridge power module, the switching unit circuit as shown in FIG. 10 is configured as each switching device of each bridge arm.

Figure 12:
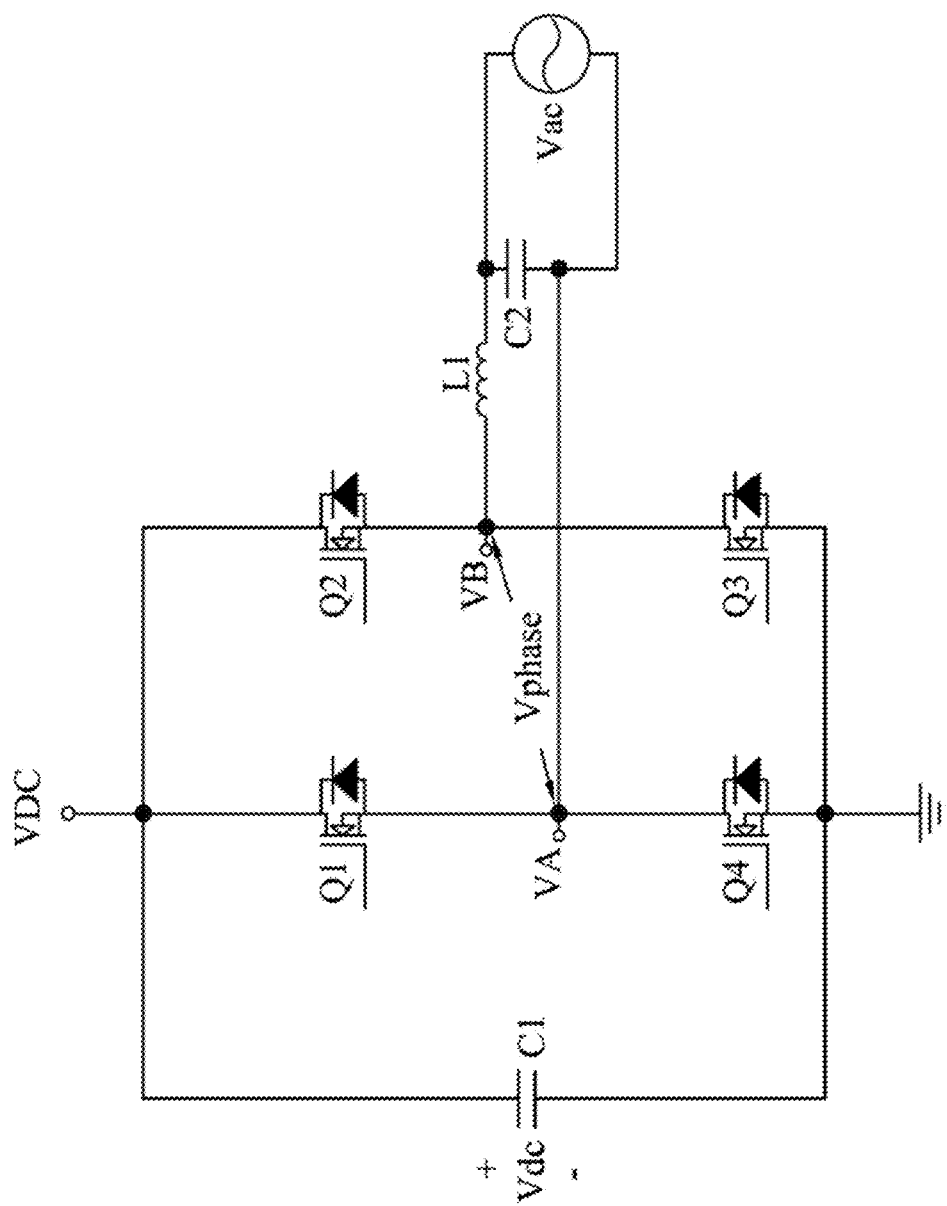
FIG. 12 is a schematic view of a non-isolated AC/DC unit according to an embodiment of the disclosure.

FIG. 12 is a schematic view of a non-isolated AC/DC unit according to an embodiment of the disclosure. As shown in FIG. 12, when the full bridge circuit is applied to a non-isolated AC/DC unit (e.g., the power factor correction (PFC) unit), the full bridge circuit is connected to an AC input voltage Vac through a filter formed by the inductance L1 and the capacitor C2, and generates a DC output voltage on the capacitor C1, in which one bridge arm (such as devices Q2 and Q3) of the circuit is operating at a high frequency state and the other bridge arm (such as devices Q1 and Q4) of the circuit is operating at a low frequency state same with the input condition. In operation, the AC input voltage Vac is transmitted to the full bridge circuit through the inductance L1, and then the bridge arm operating at the high frequency state is switched to generate a corresponding high-frequency AC output Vphase, and next the full bridge circuit rectifies the high-frequency power to a DC output Vdc to complete the power conversion process. The PFC unit operating under the aforementioned operating mode can be referred to as totem pole PFC; the conversion unit can achieve very high efficiency (for example, the conversion efficiency is greater than 98%, and even greater than 99%); and due to the existence of the bridge arm operating at the low frequency state, it can be ensured that the potential at the voltage Vdc has no significant high-frequency hopping relative to the potential at the voltage Vac, so as to achieve lower common-mode electromagnetic interference.

Furthermore, since two devices (e.g., the devices Q2 and Q3) of the totem pole PFC should be bi-directionally operated with high frequency, and the backward recovery property of the power devices such as the SiC or GaN devices is similar to a high-performance diode, these devices are suitable for the totem pole PFC. Therefore, in the power module of the embodiments of the disclosure, the power devices such as the SiC or GaN devices can be used to implement the devices of the totem pole PFC (e.g., the devices Q2 and Q3), and thus all the advantages of the embodiments of the disclosure can be obtained to further achieve the totem pole PFC with excellent performance.

Figure 13:
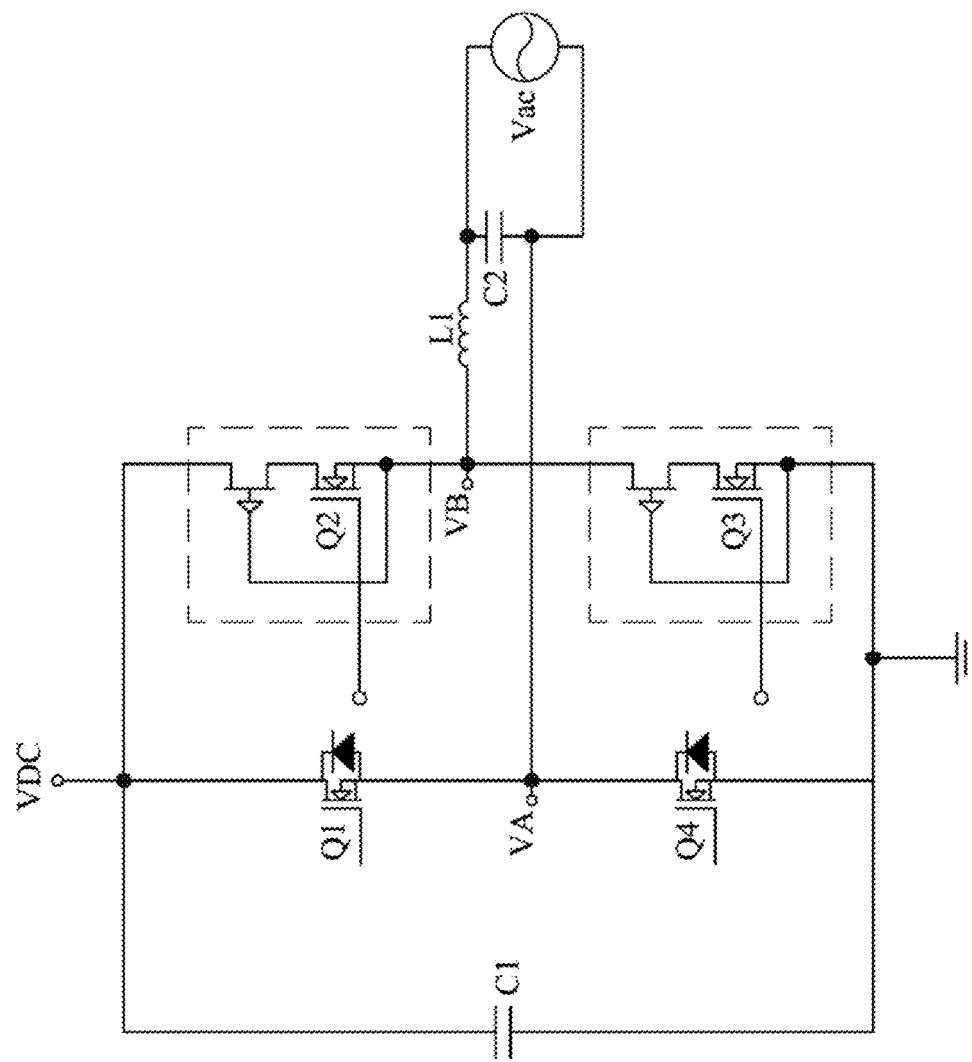
FIG. 13 is a schematic view of a conversion unit according to an embodiment of the disclosure.

Furthermore, the devices Q2 and Q3 may also be replaced by the devices shown in FIG. 10 to enable the entire circuit to have better performance. FIG. 13 is a schematic view of a conversion unit according to an embodiment of the disclosure, in which the devices Q2 and Q3 are implemented by the devices shown in FIG. 10 to enable the entire circuit to have better performance.

Figure 14:
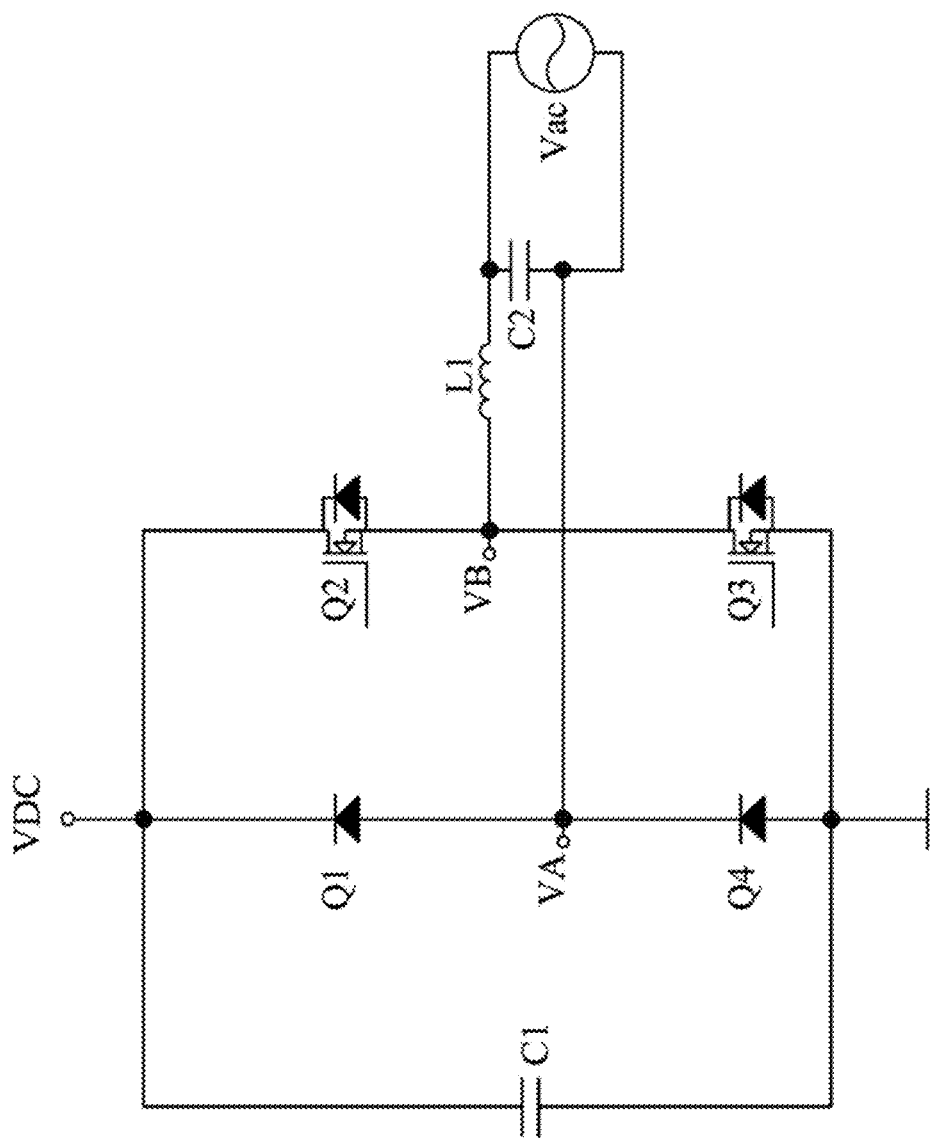
FIG. 14 is a schematic view of a conversion unit according to another embodiment of the disclosure.

FIG. 14 is a schematic view of a conversion unit according to another embodiment of the disclosure, in which the conversion unit can also achieve an AC-to-DC conversion or DC-to-AC conversion function, and the devices Q1 and Q4 are implemented by diodes, so as to make the circuit simpler and more economic and to realize a higher performance/price ratio.

Figure 15:
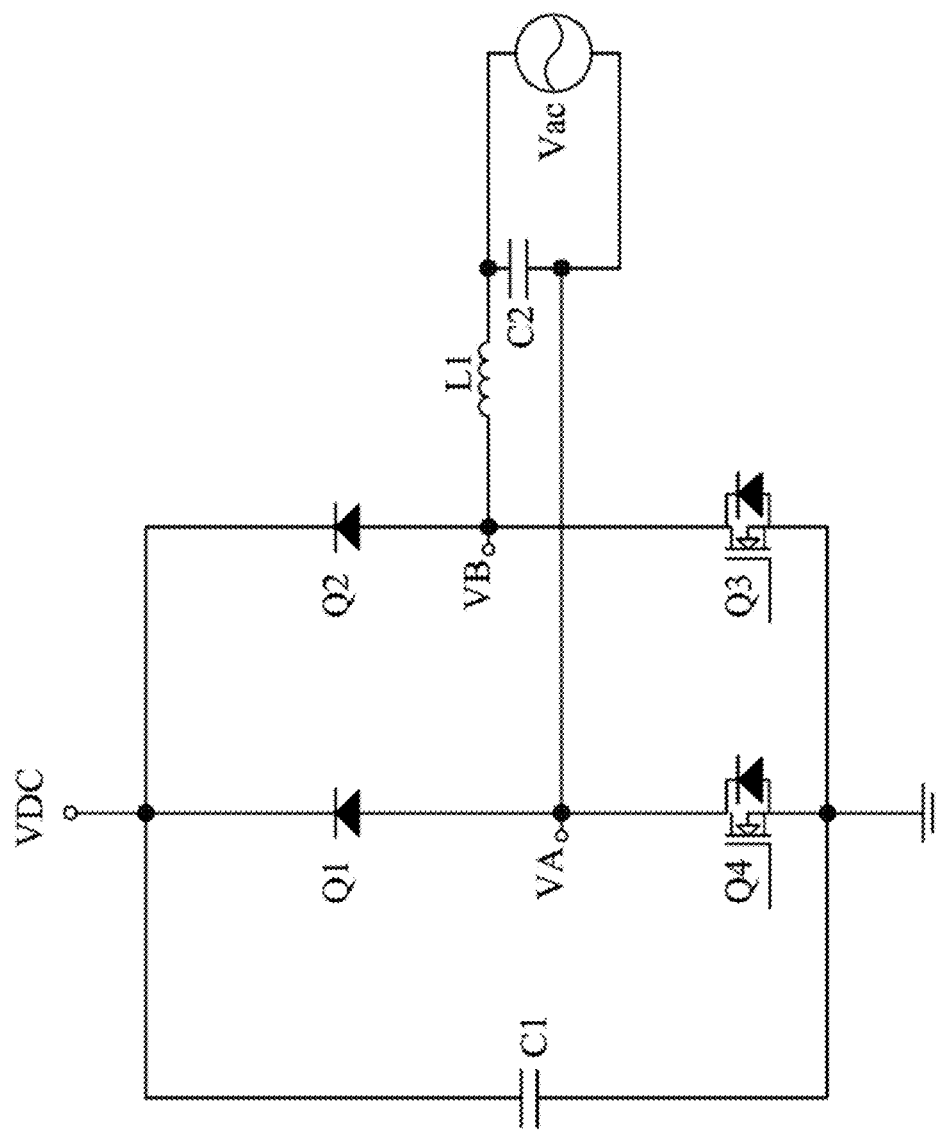
FIG. 15 is a schematic view of a conversion unit according to a further embodiment of the disclosure.

FIG. 15 is a schematic view of a conversion unit according to a further embodiment of the disclosure, in which the conversion unit can also achieve an to AC-to-DC conversion function, and the devices Q1 and Q2 are implemented by diodes, so as to make the circuit simpler and more economic and to realize a higher performance/price ratio.

A power system is disclosed hereinafter according to another aspect of the disclosure. FIG. 16A is a schematic view of a power system according to an embodiment of the disclosure. As shown in FIG. 16A, a power system 1000a includes a power module 1010 and a circuit board 1020. The power module 1010 may be a power module of any of the aforementioned embodiments, and is perpendicularly disposed on the circuit board 1020.

In an embodiment, the power module 1010 includes a plurality of pins (e.g., a pin 1015 as shown in FIG. 16A), in which the pins can be pins of any of the aforementioned embodiments. The pins are arranged symmetrically, and are perpendicularly disposed on the circuit board 1020 by extending from the underneath of the power module 1010.

Furthermore, in this embodiment, heat dissipation channels 1032 and 1034 are respectively disposed between two sides of the power module 1010 and the operating devices 1042 and 1044, so that the heat dissipation capability of the power module 1010 can be improved to the maximum, so as to reduce the requirement of the air flow and reduce power loss and noise pollution. The operating device 1042 may be a capacitive element, such as an electrolytic capacitor or capacitors of other types, and the operating device 1044 may be a magnetic element, such as an inductance or a transformer. In practice, since the power module 1010 is perpendicularly disposed on the circuit board 1020 and other devices can also be installed on the surface of the circuit board 1020 like the power module 1010, the space and air flow can be fully used to the maximum extent, and meanwhile it is convenient for fabrication and maintenance.

Moreover, the power system 1000a may further include a heat dissipation device 1050, in which the heat dissipation device 1050 may be integrated with the power module 1010 or attached at one side of the power module 1010.

Additionally, the power system 1000a may further include a housing case 1060, in which the power module 1010, the circuit board 1020, the heat dissipation device 1050, and the operating devices 1042 and 1044 are all accommodated in the housing case 1060.

Figure 16B:
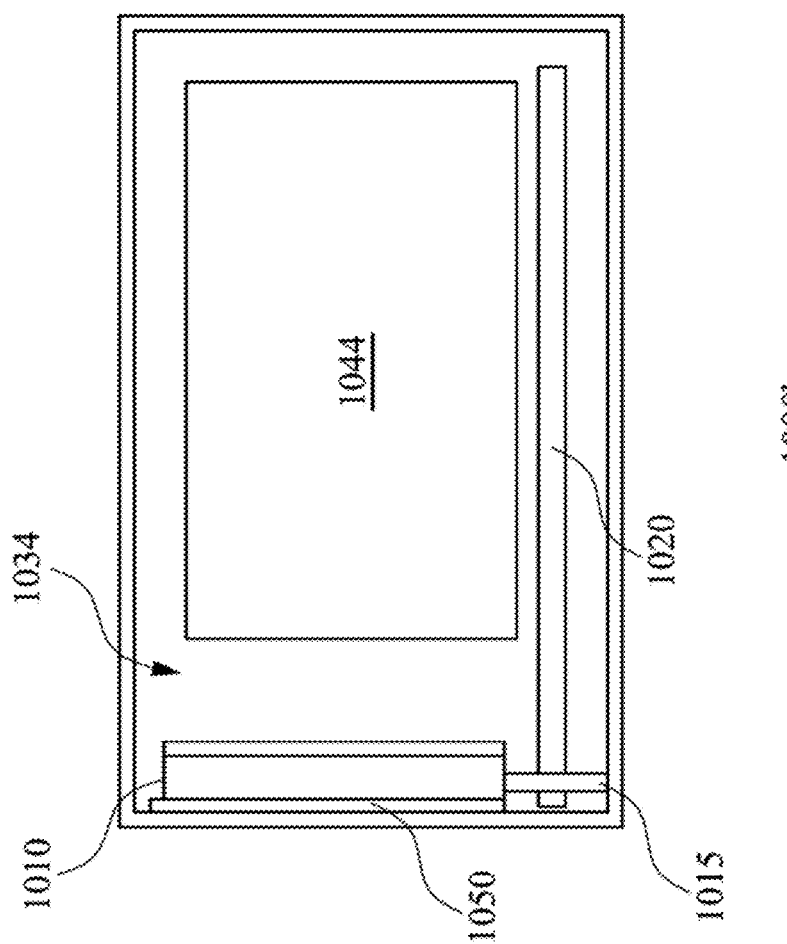
FIG. 16B is a schematic view of a power system according to another embodiment of the disclosure.

FIG. 16B is a schematic view of a power system according to another embodiment of the disclosure. Compared with FIG. 16A, in a power system 1000b of this embodiment, the power module 1010, the circuit board 1020 and the operating device 1044 are all accommodated in the housing case 1060; and a heat dissipation channel 1034 is arranged between one side of the power module 1010 and the operating device 1044, and the other opposite side of the power module 1010 is attached on the housing case 1060. In other words, the power system 1000b of this embodiment has only one single heat dissipation channel. For example, the heat generated by the power module 1010 is mainly dissipated out from the inner side and the outer side of the housing case 1060, in addition to being dissipated through the molding material of the power module 1010.

FIG. 16C is a schematic view of a power system according to a further embodiment of the disclosure. Compared with FIG. 16B, in a power system 1000c of this embodiment, pins 1015 of the power module 1010 are arranged symmetrically and extend from one side of the power module 1010 to connect to the circuit board 1020, the power module 1010 and the operating device 1044 are disposed respectively at two opposite sides of the circuit board 1020; and the power module 1010 is disposed horizontally relative to the circuit board 1020. Furthermore, one side of the power module 1010 may also be attached to the housing case 1060, so that the heat generated by the power module 1010 can be dissipated out from the inner side and the outer side of the housing case 1060.

Therefore, even when the width of the power system is small, a face of the power module with excellent heat dissipation capability can also be directly installed on the housing case, so as to similarly ensure the two-sided heat dissipation capability of the power module, and such a design can be applied to a condition with no air flow to dissipate heat only through the housing case.

A method for fabricating a power module is disclosed hereafter according to a further implementation aspect of the disclosure. This method can be applied to fabricate a power module of any of the aforementioned embodiments, but are not limited to those. For clearance and convenience of illustration, the method for fabricating the power module is described hereafter with reference to the embodiments shown in FIGS. 7A-7D.

As shown in FIG. 7A, the semiconductor devices Q1 and Q2 are symmetrically disposed on the substrate 702; the semiconductor devices Q3 and Q4 are symmetrically disposed on the substrate 702; and the common pins VA and VB are symmetrically directed from the same side of the substrate 702. The semiconductor devices Q1 and Q4 are connected with each other through the common pin VA, and are disposed adjacently; and the semiconductor devices Q2 and Q3 are connected with each other through the common pin VB, and are disposed adjacently, so as to reduce the loop inductances of the first bridge arm 710 formed by the semiconductor devices Q1 and Q4 and the second bridge arm 720 formed by the semiconductor devices Q2 and Q3.

Moreover, in an embodiment, the aforementioned method may further include symmetrically directing two groups of pins having relatively large withstand voltages from two outmost positions at the same side of the substrate 702 (e.g., power source pins VDC at the two outmost positions), and directing a group of pins having minimum withstand voltages from an intermediate position at the same side of the substrate 702 (e.g., a group of pins including a ground pin GND).

In another embodiment, the aforementioned method may further include the following steps: symmetrically directing pins G1 and G2 from the same side of the substrate 702, in which the pin G1 is connected with the semiconductor device Q1 and is disposed adjacently to the common pin VA, and the pin G2 is connected with the semiconductor device Q2 and is disposed adjacently to the common pin VB; symmetrically extending pins G3 and G4 from the same side of the substrate 702, in which the pin G3 is connected with the semiconductor device Q3 and the pin G4 is connected with the semiconductor device Q4; symmetrically directing two power source pins VDC from the two outmost positions at the same side of the substrate 702, in which the two power source pins VDC are disposed as respectively being away from the first pin and the second pin; and directing a ground pin GND between pins G3 and G4.

Furthermore, as shown in FIG. 7C, the aforementioned method may further include the following steps: directing a driving pin S1 between the pin G1 and the common pin VA, in which the pins G1, VA and S1 are disposed adjacently; directing a driving pin S2 between the pin G2 and the common pin VB, in which the pins G2, VB and S2 are disposed adjacently; directing a driving pin S3 between the pin G3 and the ground pin GND; and directing a driving pin S4 between the pin G4 and the ground pin GND.

Additionally, as shown in FIG. 7B, according to the aforementioned embodiments, the aforementioned method may further include: arranging a capacitor Cin at a relatively intermediate position between the semiconductor devices Q3 and Q4 on the substrate 702.

The sequence of the steps stated above can be adjusted according to practical demands, unless otherwise the sequence is stated definitely and partial or all of the steps can even be performed simultaneously. The steps stated above are only used as examples, and are not intended to limit the disclosure.

It can be seen from the aforementioned embodiments of the disclosure, by applying the aforementioned power module or method for fabricating the power module, the loop inductances corresponding to the bridge arms of the power module are symmetric, and thus the turn-off voltages corresponding to the semiconductor devices of the bridge arms are also symmetric, to further reduce the voltage spikes or peaks generated during the turn-off operation, decrease the electromagnetic interferences to the power module and decrease the influence on the circuit, thereby enabling the power module 100a to exhibit the optimal performance. Furthermore, the power converter can have improved power density or efficiency, and have better thermal, electric, economic, electromagnetic shielding performances and better reliability compared with the prior art.

Although the disclosure has been disclosed with reference to the above embodiments, these embodiments are not intended to limit the disclosure. It will be apparent to those of skills in the art that various modifications and variations can be made without departing from the spirit and scope of the disclosure. Therefore, the scope of the disclosure shall be defined by the appended claims.

What is claimed is:

1. A power module, comprising:
 a bridge circuit, comprising:
  a first bridge arm having a first terminal, a second terminal and a third terminal, wherein the first bridge arm comprises a first semiconductor device and a second semiconductor device connected in series or in cascade with each other, and the first semiconductor device and the second semiconductor device are electrically connected to the third terminal of the first bridge arm; and
  a second bridge arm having a first terminal, a second terminal and a third terminal, wherein the second bridge arm comprises a third semiconductor device and a fourth semiconductor device connected in series or in cascade with each other, and the third semiconductor device and the fourth semiconductor device are electrically connected to the third terminal of the second bridge arm; and
 at least one capacitance bridge arm connected in parallel with the first bridge arm and the second bridge arm, wherein the capacitance bridge arm comprises a first capacitor, and the first capacitor is connected in parallel with the first bridge arm and the second bridge arm and is disposed at an intermediate circuit position relative to the first bridge arm and the second bridge arm, and the distance between the first capacitor and the second semiconductor device is substantially the same as the distance between the first capacitor and the fourth semiconductor device;
 wherein the first bridge arm and the second bridge arm are connected in parallel with each other, and circuit positions of the first bridge arm and the second bridge arm are substantially symmetric with each other, so as to reduce voltage spikes or reduce the difference of the voltage spike generated during operations of the first, second, third and fourth semiconductor devices.

2. The power module as claimed in claim 1, wherein the circuit position of the capacitance bridge arm relative to the first bridge arm is substantially symmetric with that of the capacitance bridge arm relative to the second bridge arm, to reduce a difference between the voltage spikes generated during operations of the first bridge arm and the second bridge arm.

3. The power module as claimed in claim 1, wherein the capacitance bridge arm further comprises a second capacitor and a third capacitor, and the first, second and third capacitors are connected in parallel with the first bridge arm and the second bridge arm, and the second and third capacitors are disposed at substantially symmetric circuit positions relative to the first bridge arm and the second bridge arm.

4. The power module as claimed in claim 1, wherein the first bridge arm and the capacitance bridge arm form a first loop, the second bridge arm and the capacitance bridge arm form a second loop, and an inductance value of the first loop and/or second loop is less than a first predetermined value.

5. The power module as claimed in claim 4, wherein an inductance difference value between the first loop and the second loop is less than a second predetermined value.

6. The power module as claimed in claim 4, wherein the first loop and the second loop have substantially the same inductance value.

7. The power module as claimed in claim 1, wherein each of the first, second, third and fourth semiconductor devices has a control pin and a driving pin, and the control pin and the driving pin cooperate with each other to drive the corresponding semiconductor device to be turned on.

8. The power module as claimed in claim 1, wherein at least two of the first, second, third and fourth semiconductor devices are active devices.

9. The power module as claimed in claim 1, wherein the first, second, third and fourth semiconductor devices are all active devices.

10. The power module as claimed in claim 1, wherein the first and the second semiconductor devices of the first bridge arm are both active devices.

11. The power module as claimed in claim 1, wherein at least one of the first and the second semiconductor devices of the first bridge arm is an active device, and at least one of the third and fourth semiconductor devices of the second bridge arm is an active device.

12. The power module as claimed in claim 8, wherein all the active devices are metal oxide semiconductor field effect transistors, insulated gate bipolar transistors, silicon carbide (SiC) power transistors or gallium nitride (GaN) power transistors.

13. The power module as claimed in claim 1, wherein the bridge circuit is arranged in an AC-to-DC circuit, a DC-to-AC circuit, a DC-to-DC circuit, an AC-to-AC circuit or a bi-directional power transmission circuit.

14. A power module, comprising:
a first common pin;
a second common pin, wherein the first common pin and the second common pin are substantially symmetrically disposed at one side of a substrate;
a first bridge arm disposed on the substrate, the first bridge arm comprising a first semiconductor device and a second semiconductor device, wherein the first semiconductor device and the second semiconductor device are connected to each other through the first common pin and are disposed adjacently; and
a second bridge arm disposed on the substrate, the second bridge arm comprising a third semiconductor device and a fourth semiconductor device, wherein the third semiconductor device and the fourth semiconductor device are connected to each other through the second common pin and are disposed adjacently;
wherein the first and the third semiconductor devices are disposed substantially symmetrically, and the second and the fourth semiconductor devices are disposed substantially symmetrically and respectively disposed on one side of the first semiconductor device and one side of the third semiconductor device.

15. The power module as claimed in claim 14, further comprising:
at least three groups of pins arranged abreast at the same side of the substrate, wherein two of the three groups of pins which have relatively large withstand voltage are substantially symmetrically disposed at two outmost positions of the same side of the substrate, and one of the three groups of pins which has a minimum withstand voltage is disposed at an intermediate position of the same side of the substrate.

16. The power module as claimed in claim 14, further comprising:
a first pin connected to the first semiconductor device, wherein the first pin and the first common pin are disposed adjacently;
a second pin connected to the second semiconductor device;
a third pin connected to the third semiconductor device, the first pin and the third pin disposed symmetrically, wherein the third pin and the second common pin are disposed adjacently;
a fourth pin connected to the fourth semiconductor device, the second pin and the fourth pin disposed symmetrically;
at least one of a first power source pin and a second power source pin, symmetrically disposed at the outmost position of the same side of the substrate relative to the first pin and the third pin and being disposed away from the first pin and the third pin; and
a ground pin disposed between the second pin and the fourth pin.

17. The power module as claimed in claim 16, further comprising:
a first driving pin connected to the first semiconductor device and disposed adjacently between the first pin and the first common pin;
a second driving pin connected to the second semiconductor device and disposed adjacently between the second pin and the second common pin;
a third driving pin connected to the third semiconductor device and disposed adjacently between the third pin and the ground pin;
a fourth driving pin connected to the fourth semiconductor device and disposed adjacently between the fourth pin and the ground pin.

18. The power module as claimed in claim 14, further comprising:
a capacitor disposed at a relatively intermediate position between the second and the fourth semiconductor devices.

19. The power module as claimed in claim 14, further comprising:
a thermal sensitive resistance device integrated on the substrate; and
at least one temperature signal pin connected to the thermal sensitive resistance device.

20. The power module as claimed in claim 19, wherein one of the temperature signal pins is configured to be a ground pin.

21. The power module as claimed in claim 14, wherein the first, second, third and fourth semiconductor devices are covered within a molding material, and a thermal conductivity coefficient of the molding material is greater than 1 W/(m·K).

22. The power module as claimed in claim 14, wherein the molding material disposed above each of the first, second, third and fourth semiconductor devices has a thickness less than 2 millimeters.

23. The power module as claimed in claim 14, wherein each of the first, second, third and fourth semiconductor devices is connected to a bonding wire, and the molding material disposed above a top end of the bonding wire has a thickness less than 0.5 millimeters.

24. The power module as claimed in claim 14, wherein each of the first, second, third and fourth semiconductor devices is fabricated in a form of chip.

25. The power module as claimed in claim 14, wherein the power module is applied in a power converter, a power density and a highest efficiency of the power converter are respectively greater than 25 W/inch3 and higher than 95%, or alternatively the power density of the power converter is greater than 30 W/inch3, or alternatively the highest efficiency of the power converter is higher than 96%.

26. The power module as claimed in claim 25, wherein a highest operating frequency of the power converter is greater than 50 kHz.

27. The power module as claimed in claim 26, wherein a highest operating frequency of the power converter is greater than 100 kHz.

28. The power module as claimed in claim 27, wherein a highest operating frequency of the power converter is greater than 200 kHz.

29. A power system, comprising:
a power module, comprising:
a first bridge arm comprising a first semiconductor device and a second semiconductor device, wherein the first semiconductor device and the second semiconductor device are connected to each other and disposed adjacently; and
a second bridge arm comprising a third semiconductor device and a fourth semiconductor device, wherein the third semiconductor device and the fourth semiconductor device are connected to each other and disposed adjacently;
at least one capacitance bridge arm connected in parallel with the first bridge arm and the second bridge arm, wherein the capacitance bridge arm comprises a first capacitor, and the first capacitor is connected in parallel with the first bridge arm and the second bridge arm and is disposed at an intermediate circuit position relative to the first bridge arm and the second bridge arm, and the distance between the first capacitor and the second semiconductor device is substantially the same as the distance between the first capacitor and the fourth semiconductor device; and
a circuit board, wherein the power module is perpendicularly disposed on the circuit board.

30. The power system as claimed in claim 29, wherein the power module comprises a plurality of pins, the pins are arranged symmetrically and extend from one side of the power module to connect with the circuit board.

31. The power system as claimed in claim 30, wherein the power module is perpendicularly disposed on the circuit board or horizontally disposed relative to the circuit board.

32. The power system as claimed in claim 29, wherein a heat dissipation channel is arranged between at least one side of the power module and an operating device.

33. The power system as claimed in claim 29, further comprising:
a housing case, wherein the power module and the circuit board are accommodated in the housing case, a heat dissipation channel is arranged between one side of the power module and an operating device, and the other opposite side of the power module is attached to the housing case.

34. The power system as claimed in claim 29, further comprising:
a heat dissipation device integrated or attached to the power module.

35. A method for fabricating a power module, comprising:
substantially symmetrically disposing a first semiconductor device and a second semiconductor device on a substrate;
substantially symmetrically disposing a third semiconductor device and a fourth semiconductor device on the substrate; and
substantially symmetrically directing a first common pin and a second common pin from one side of the substrate, wherein the first semiconductor device and the third semiconductor device are connected with each other through the first common pin and are disposed adjacently, and the second semiconductor device and the fourth semiconductor device are connected with each other through the second common pin and are disposed adjacently.

36. The method as claimed in claim 35, further comprising:
substantially symmetrically directing two groups of pins having relatively large withstand voltage from two outmost positions of the same side of the substrate; and
directing a group of pins having the minimum withstand voltage from an intermediate position of the same side of the substrate.

37. The method as claimed in claim 35, further comprising:
substantially symmetrically directing a first pin and a second pin from the same side of the substrate, wherein the first pin is connected to the first semiconductor device and is disposed adjacently to the first common pin, and the second pin is connected to the second semiconductor device and is disposed adjacently to the second common pin;
substantially symmetrically directing a third pin and a fourth pin from the same side of the substrate, wherein the third pin is connected to the third semiconductor device, and the fourth pin is connected to the fourth semiconductor device;
substantially symmetrically directing a first power source pin and a second power source pin from two outmost positions at the same side of the substrate, wherein the first power source pin and the second power source pin are respectively disposed away from the first and the second pins; and
directing a ground pin between the second pin and the fourth pin.

38. The method as claimed in claim 37, further comprising:
directing a first driving pin between the first pin and the first common pin, wherein the first pin, the first common pin and the first assistant driving pin are disposed adjacently;
directing a second driving pin between the second pin and the second common pin, wherein the second pin, the second common pin and the second assistant driving pin are disposed adjacently;
directing a third driving pin between the third pin and the ground pin;
directing a fourth driving pin between the fourth pin and the ground pin.

39. The method as claimed in claim 35, further comprising:
disposing a capacitor at a relatively intermediate position between the third and the fourth semiconductor devices on the substrate.

* * * * *